United States Patent
Yamada et al.

(10) Patent No.: US 7,618,266 B2
(45) Date of Patent: Nov. 17, 2009

(54) ANISOTROPIC CONDUCTIVE CONNECTOR, CONVERSION ADAPTER FOR INSPECTION DEVICE HAVING THE ANISOTROPIC CONDUCTIVE CONNECTOR, AND METHOD FOR MANUFACTURING THE ANISOTROPIC CONDUCTIVE CONNECTOR

(75) Inventors: Daisuke Yamada, Hidaka (JP); Kiyoshi Kimura, Hidaka (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/097,769

(22) PCT Filed: Dec. 19, 2006

(86) PCT No.: PCT/JP2006/325216

§ 371 (c)(1),
(2), (4) Date: Jul. 11, 2008

(87) PCT Pub. No.: WO2007/072789

PCT Pub. Date: Jun. 28, 2007

(65) Prior Publication Data

US 2008/0311769 A1 Dec. 18, 2008

(30) Foreign Application Priority Data

Dec. 21, 2005 (JP) .............................. 2005-367578

(51) Int. Cl.
*H01R 4/56* (2006.01)

(52) U.S. Cl. .............................. 439/90; 439/66; 439/70

(58) Field of Classification Search ............. 439/66–67, 439/70–71, 90–91
See application file for complete search history.

(56) References Cited

U.S. PATENT DOCUMENTS

| 5,298,686 | A | * | 3/1994 | Bourdelaise et al. | ........ 174/254 |
|---|---|---|---|---|---|
| 5,599,193 | A | * | 2/1997 | Crotzer | ......................... 439/66 |
| 6,027,346 | A | * | 2/2000 | Sinsheimer et al. | ........... 439/66 |
| 6,168,442 | B1 | | 1/2001 | Naoi | |
| 6,524,115 | B1 | * | 2/2003 | Gates et al. | .................... 439/66 |
| 6,604,953 | B2 | | 8/2003 | Igarashi et al. | |
| 7,160,123 | B2 | | 1/2007 | Yamada et al. | |
| 7,255,579 | B2 | * | 8/2007 | Sato et al. | ...................... 439/91 |
| 7,384,280 | B2 | | 6/2008 | Yamada et al. | |

FOREIGN PATENT DOCUMENTS

| JP | 62 254491 | 11/1987 |
|---|---|---|
| JP | 11 160396 | 6/1999 |
| JP | 2000 241498 | 9/2000 |
| JP | 2005 317214 | 11/2005 |
| JP | 2005 326307 | 11/2005 |

* cited by examiner

*Primary Examiner*—Truc T Nguyen
(74) *Attorney, Agent, or Firm*—Oblon, Spivak, McClelland, Maier & Neustadt, L.L.P.

(57) ABSTRACT

The anisotropically conductive connector 36 of the present invention includes an anisotropic sheet 102 made up of conducting path forming parts 69 to electrically connect an electrode 101 of an electronic component 33 with an electrode for inspection of a circuit substrate 12 for inspections and of an anisotropically conductive film to insulate the conducting path forming parts 69 and a positioning member 103 connected between the anisotropically conductive sheet 102 and electronic component 33 and having an aperture portion in a position corresponding to the conducting path forming part 69, wherein the positioning member 103 has an insulating layer formed in a location surrounding a perforated metallic member and, when the electrode 101 is fitted into the aperture portion 107, the electrode 101 is guided into the conducting path forming parts 69.

6 Claims, 17 Drawing Sheets

ANISOTROPIC CONDUCTIVE CONNECTOR, CONVERSION ADAPTER FOR INSPECTION DEVICE HAVING THE ANISOTROPIC CONDUCTIVE CONNECTOR, AND METHOD FOR MANUFACTURING THE ANISOTROPIC CONDUCTIVE CONNECTOR

TECHNICAL FIELD

The present invention relates to an anisotropically conductive connector connected, to electrically connect an electronic component being a subject to be inspected with a circuit substrate for inspections, between the electronic component and the circuit substance for inspections, a converting adaptor for an inspecting apparatus equipped with the anisotropically conductive connector and inspecting apparatus, and a method for fabricating the anisotropically conductive connector.

BACKGROUND TECHNOLOGY

As electronic devices become small-sized and provide high performance in recent years, there is a tendency that the number of electrodes of electronic components of semiconductors or the like is increased and its electrode pitch becomes smaller and finer. In a package LSI (Large-scale Integration) circuit such as a BGA (Ball Grid Array) having a bump-shaped electrode protruded on its rear, in the case when the LSI circuit is mounted on a device, its exclusively occupied area is made small, which shows increased importance. Thus, on the side of the inspecting apparatus to perform electrical inspections on the electronic component, it is required that its electrode pitch is made smaller and finer in response to a smaller pitch of the electrode of the electronic component to reliably connect an electronic component with the inspecting apparatus and, therefore, at a time of electrical inspections, an anisotropically conductive sheet is interposed between the inspecting apparatus and electronic component being a subject to be inspected.

The anisotropically conductive sheet of this type is generally configured so that a conducting path, when being pushed with pressure, is formed in a direction of thickness only and is effective in that electrical connection with an inspecting apparatus can be achieved without impairing an electrode of an electronic component being a subject to be inspected at a time of electrical inspections. When an electrical inspection is performed on an electronic component such as a BGA having a small and fine pitch of the electrode, positioning between fine and high density electrode of the electrical component and conducting path of the anisotropically conductive sheet is important and, as the pitch between electrodes become finer and require higher density, the importance of the positioning becomes important, thus requiring technological resolution.

Conventionally, for example, as shown in FIG. 24, technology is proposed in which, by placing an insulating sheet 5 between an electronic component 1 and an anisotropically conductive sheet 2 having an aperture 4 formed in a location corresponding to a protruded electrode 3 of the electronic component 1 and by fitting an electrode 3 of the electronic component 1 into the aperture portion 4, the electrode 3 of the electronic component 1 is positioned in a conducting path 6 of the anisotropically conductive sheet 2 (for example, see Patent References 1 to 5).

Patent references: Japanese Application Laid-open Nos. Hei 11-1603963, Hei 10-84972, 2001-93599, Hei 8-271578, and Hei 10-10191.

DISCLOSURE OF THE INVENTION

Problems to be Solved by the Invention

However, in the conventional technology described above, the positioning member for the insulating sheet 5 or the like is attached individually and separately from the anisotropically conductive sheet 2 and, as a result, at a time of electrical inspections, positioning of the positioning member relative to the anisotropically conductive sheet 2 is required. Therefore, the conventional technology has problems that the reliable positioning of the electrode 3 of the electronic component 1 to the conducting path 6 of the anisotropically conductive sheet 2 is difficult and there is a fear of insufficient electrical establishment between the electrode 3 and the conducting path 6 and much time and effort are taken in the inspection work.

The conventional positioning member described above is made of an insulating material causing insufficient thermal resistance and, as a result, there is a fear of deformation caused by heat occurring when the electrical inspection is performed. On the other hand, when the positioning member is to be manufactured by using a metallic material having thermal resistance, it is difficult to fabricate the aperture 4 so as to satisfy the fineness and high-density of the electrode 3 of the electronic component 1 and also there is a fear of contact of the positioning member with the electrode 3 of the electronic component 1 or with the conducting path 6 of the anisotropically conductive sheet 2, which causes a problem in terms of safety.

In view of the above, an object of the present invention is to provide an anisotropically conductive connector capable of easily positioning an electronic component to the anisotropically conductive sheet, sufficiently establishing electrical connection between the electronic component and the anisotropically conductive sheet, simplifying inspection work, and enhancing safety without being deformed by heat, a converting adaptor for an inspecting apparatus equipped with the anisotropically conductive connector and a method of fabricating the anisotropically conductive connector.

Means for Solving Problems

To achieve the above object, the present invention is characterized in that an anisotropically conductive connector is provided which is connected, to electrically connect an electronic component being a subject to be inspected having a protruded electrode portion with a circuit substrate for inspection having an electrode for inspections, between an electrode portion of the electronic component and an electrode portion for inspections of the circuit substrate for inspection, including an anisotropically conductive sheet having an anisotropically conductive film comprising conducting path forming parts to electrically connect an electrode portion of the electrical component with an electrode portion for inspections of the circuit substrate for inspections and an insulating portion to insulate the conducting path forming parts from one another, a positioning member placed between the anisotropically conductive sheet and the electronic component having an aperture portion formed at a position corresponding to each of the conducting path forming parts and wherein the positioning member comprising an insulating layer formed in a portion surrounding a perforated metallic member and when an electrode portion of the electronic component is fitted into an aperture portion of the positioning member, said electrode portion is guided into the conducting path forming part.

The above perforated metallic member is formed to be grid-like and an insulating layer is formed in a portion surrounding portions other than at least a crossing portion of the perforated metallic member.

The above positioning member may be integrally formed with the anisotropically conductive sheet by bonding the insulating layer formed in a portion surrounding the perforated metallic member to an insulating portion of the anisotropically conductive sheet.

In a region surrounding the above anisotropically conductive film may be formed a step portion and a supporting body to support a peripheral edge portion of the anisotropically conductive film may be formed in the step portion.

Also, the present invention is characterized in that a converting adaptor is provided which electrically connects an electronic component being a subject to be inspected having a protruded electrode portion with a circuit substrate for inspections having an electrode for inspections to be used for an inspecting apparatus installed in the inspecting apparatus to perform electrical inspections on an electronic component, including the anisotropically conductive connector described above.

Moreover, the present invention is characterized in that an inspecting apparatus is provided which electrically connects an electronic component being a subject to be inspected having a protruded electrode portion with a circuit substrate for inspections having an electrode for inspections and to perform electrical inspections on the electronic component, including anisotropically conductive connector described above.

Furthermore, the present invention is characterized in that a method for fabricating an anisotropically conductive connector connected, to electrically connect an electronic component being a subject to be inspected having a protruded electrode portion with a circuit substrate for inspections having an electrode for inspections, between an electrode portion of the electronic component and an electrode portion for inspections of the circuit substrate for inspections, including a step of (A) fabricating a perforated metallic member obtained by forming a large number of holes in a metallic member using an etching process, a step of (B) placing the perforated metallic member fabricated in the (A) process into a forming mold along a concave portion formed in the forming mold so as to be positioned upward the concave portion, a step of (C) placing a mask having holes in locations corresponding to the concave portion in the forming mold on the perforated metallic member in the forming mold formed in the (B) process, a step of (D) flowing a liquid insulating material into the concave portion from each of holes of the mask formed in the (C) process and forming an insulating layer in a portion surrounding the perforated metallic member to fabricate a positioning portion having an aperture portion, a step of (E) placing the positioning member fabricated in the (D) process on the anisotropically conductive sheet so that the aperture portion of the positioning portion is located in a position corresponding to a conducting path forming part and a step of (F) heating the anisotropically conductive sheet and the positioning member with the positioning member being placed in the anisotropically conductive sheet in the (E) process and bonding an insulating portion of the anisotropically conductive sheet to insulate the conducting path forming parts from one another to the insulating layer of the positioning member to integrate the anisotropically conductive sheet with the positioning member.

EFFECTS OF THE INVENTION

According to the present invention, the positioning member is fabricated integrally with the anisotropically conductive sheet and, therefore, at a time of electrical inspections, positioning of the positioning member relative to the anisotropically conductive sheet is not required and there is no possibility of displacements of the positioning member, which enables easy and smooth inspection work.

Also, when the electrode portion of an electronic component is fitted into the aperture portion of the positioning member, the electrode portion is guided into the conducting path forming part of the anisotropically conductive sheet and, therefore, the electrode portion of the electronic component can be positioned reliably to the anisotropically conductive sheet and sufficient electrical connection between the electrode portion and conducting path forming part can be established, which can enhance the reliability of the electrical inspections.

Also, since main members of the positioning member is made of metallic members, thermal resistance can be sufficiently obtained, thereby eliminating the fear of deformation of the positioning member caused by heat occurring at a time of electrical inspections.

Also, the positioning member is fabricated in a manner in which the insulating layer is formed in a portion surrounding the perforated metallic member and, therefore, the aperture portion can be formed easily and accurately in a position corresponding to the conducting path forming part of the anisotropically conductive sheet and, as a result, when an electronic component being a subject to be inspected is made small and fine, sufficient inspection can be performed.

Also, since the positioning member is insulated by the insulating layer, there is no fear of a short circuit caused by the contact between the positioning member and the electrode portion of the electronic component and/or the conducting path forming part of the anisotropically conductive sheet, thus presenting no problem in terms of safety.

Furthermore, by heating the positioning member in a state in which the positioning member is placed on the anisotropically conductive sheet, the insulating portion of the anisotropically conductive sheet is made to come into contact with the insulating layer of the positioning member which enables integration between the anisotropically conductive sheet and the positioning member and, therefore, there is no fear of peeling between the anisotropically conductive sheet and positioning member caused by a difference in a thermal expansion coefficient, which can enhance the reliability of the inspected products. Thus, the present invention can provide various advantages.

BEST MODE OF CARRYING OUT THE INVENTION

Hereinafter, an embodiment of the present invention is described by referring to drawings.

First, a converting adaptor to be used for an inspecting apparatus which performs electrical inspections on electronic components according to the embodiment of the present invention is described by referring to FIGS. 1 and 2. FIG. 1 is a cross-sectional view showing the converting adaptor to be used for the inspecting apparatus. FIG. 2 is a plan view showing a main body of the converting adaptor to be used for the inspecting apparatus.

The converting adaptor 11 for the inspecting apparatus is so configured that the main body 13 of the converting adaptor 11 is secured with a mounting tool (not shown) on a circuit board 12 such as screws or the like. The circuit board 12 has electrodes 14 mounted concentratedly in a central portion on a surface side and an input/output terminal portion 15 protrudedly formed from a rear side and the input/output terminal portion 15 can be connected to power facilities (not shown) of the inspecting apparatus. Also, the circuit board 12 may be of various types of structures including a single-sided printed circuit board, double-sided printed circuit board, and multiple-layer printed circuit board. Moreover, the circuit board 12 may be any one of a flexible board, rigid board, and flex rigid board obtained by combining these boards.

The main body 13 of the converting adaptor 11 includes a base member 16 secured on the circuit board 12, an electronic component holding member 17 placed in the base member 16 in a freely detachable manner, a lid member 18 covering an upper surface of the base member 16, a pressure-pushing member 19 to be attached to the lid member 18.

In the base member 16, to its base terminal portion is horizontally fixed a lid member supporting shaft 20 and on its end terminal portion is formed a stop protruded portion 21 and in its inside portion is formed an aperture 22. On both sides of the base member 16 are formed notching portions 23 so as to be faced with the aperture 22 interposed between the notching portions 23 and in a central portion of each of the notching portions 23 is formed, in a vertically erected manner, a holding member securing shaft 24 on the outside face of which a thread is formed. Moreover, at each of four corners of the base member 16 is formed a converting main-body attaching hole 25 into which the mounting tool is allowed to be inserted. The mounting tool passes through the converting main-body attaching hole 25 and a mounting hole (not shown) formed in the circuit board 12 corresponding to the attaching hole 25 and is screwed into a metallic plate 37 provided on a lower side of the circuit board 12, thereby securing the main body 13 of the converting adaptor 11 to the circuit board 12.

The electronic component holding member 17 is made up of a plate-like main body 26 having a shape allowed to be fitted in a state where there is play in an aperture 22 of the base member 16 and supporting pieces 27 horizontally formed protrudedly on both sides of the plate-like main body 26. In each of the supporting pieces 27 is formed a holding member securing hole 28 and by inserting the holding member securing shaft 24 through the holding member securing hole 28 and by screwing a securing tool (not shown) into the holding member securing shaft 24 with each of the supporting pieces 27 placed on the notching portions 23, the electronic component holding member 17 is secured to the base member 16.

In a central portion of the plate-like main body 26, an aperture 30 is formed with a rectangular and circular level-difference portion 29 being interposed between the plate-like main body 26 and the aperture 30 and each of electronic component supporting portions 31 extends horizontally from a side face of an inner peripheral circumference of the level-difference portion 29 toward the aperture portion 30. The space 32 surrounded by end portions of electronic component supporting portions 31 is so formed that an electronic component 33 to be inspected can be held for inspections, and in the end portion of each of the electronic component supporting portions 31 is formed an inclined face 34 downward toward the space 32 in an inclined manner. On the electronic component 33 is formed a spherically protruded electrode portion 101 (see FIG. 19).

In a lower surface of the plate-like main body 26, an anisotropically conductive connector supporting shaft 35 is placed protrudedly in a downward vertical direction in a facing position with the aperture 30 interposed therebetween and an anisotropically conductive connector 36 is supported by the anisotropically conductive connector supporting shaft 35. On the other hand, in a location corresponding to the anisotropically conductive connector supporting shaft 35 on the circuit board 12 are formed supporting treads (not shown) in a manner to sandwich the electrode portion 14 and an end portion of the anisotropically conductive connector supporting shaft 35 is allowed to be fitted into the supporting treads. This causes the anisotropically conductive connector 36 supported by the anisotropically conductive connector supporting shaft 35 to be held by the converting adaptor 11 in a state where the anisotropically conductive connector 36 is interposed between the electronic component 33 and the inspection electrode portion 14 of the circuit board 12. Moreover, the anisotropically conductive connector 36 is described in detail later.

The lid member 18 is attached to a lid member supporting shaft 20 so as to be freely rotated and to be able to open and close an upper surface of the base member 16. Moreover, momentum is given by a torsion coil spring 38 placed in a manner to surround the lid member supporting shaft 20 to the lid member in a direction (arrow direction in FIG. 1) in which an upper surface of the base member 16 is made open and a base terminal face 39 of the lid member 18 is made to come in contact with a base terminal 40 of the base member 16 in a struck manner, thereby constraining rotation of the lid member 18 in the same direction.

Moreover, in an end portion of the lid member 18 is placed so as to be freely rotated with a hook member supporting shaft 41 interposed therebetween and momentum is given by the torsion coil spring 43 placed so as to surround the hook member supporting shaft 41 to the hook member 42 in a forward direction (clockwise direction in FIG. 1). The hook member 42 has a grasping portion 44 formed in a state protruded forward and a stopping portion 45 formed in a hook state backward in the lowest terminal which is detachable in a stopped state to and from a stopping protruded portion 21. Moreover, in the lid member 18 is formed a concave portion 46 from a lower face side and, further, in a central portion of the concave portion 46 is formed a cylindrical pressure-pushing supporting hole 47 in a vertical direction and in an upper terminal portion of the pressure-pushing supporting hole 47 is formed a stopper portion 48 with its diameter reduced.

The pressure-pushing member 19 is made up of a supporting member 49 fitted into the pressure-pushing supporting hole 47 in a state where there is play and a pressure-pushing main-body member 51 formed so as to surround a lowest terminal 50 of the supporting member 49. The supporting member 49 is made up of a flange portion 53 placed slightly downward from a central portion of a circular-rod shaped portion 52 and by screwing a flat screw 54 into an upper terminal portion of the circular-rod shaped portion 52 and by placing a compressing coil spring 55 to surround the supporting member 49 between the stopper portion 48 and the flange portion 53, the pressure-pushing member 19 is extendable in up and down directions to and from the lid member 18.

The pressure-pushing main body portion 51 is made up of a supporting shaft securing portion 57 whose width is narrower than that of the base portion 56 on a lower face of the flat and cuboid-like base portion 56 formed protrudedly in a step-like manner and a pressure-pushing portion 58 whose width is narrower than that of the supporting shaft securing portion 57 on a lower face of the supporting shaft securing portion 57 formed protrudedly in a step-like manner. In the base portion 56 is formed the first concave portion 59 into which the flange portion 53 is allowed to be fitted in a state where play occurs and in the central portion of the first concave portion 59 is formed the second concave portion 60 so that a lower end portion 50 of the supporting member 49 can be fitted in a state where play occurs over the base portion 56 to the supporting shaft securing section 57. To the supporting shaft securing portion 57 is bonded a pressure-pushing main-body member supporting shaft 61 and a lower terminal portion 50 of the supporting member 49 is formed on the pressure-pushing main-body member supporting shaft 61 so as to be freely rotated.

Next, the anisotropically conductive connector 36 of the embodiment of the present invention is described in detail by referring to FIGS. 3 to 18. FIG. 3 is a plan view showing an anisotropically conductive sheet of the anisotropically conductive connector of the embodiment. FIG. 4 is a cross-sectional view of the anisotropically conductive sheet of FIG. 3 taken along the line A-A. FIG. 5 is a partially expanded cross-sectional view of the anisotropically conductive sheet of FIG. 4. FIG. 6 is a plan view showing a supporting body of the anisotropically conductive sheet. FIG. 7 is a cross-sectional view of the anisotropically conductive sheet of FIG. 6 taken along the line B-B. FIG. 8 is a cross-sectional view of a metallic mold for the formation of an anisotropically conductive film. FIG. 9 is a cross-sectional view showing a state in which a spacer and a supporting body are placed on a forming face of a lower mold. FIG. 10 is a cross-sectional view showing a state in which the first forming material layer is formed on a forming face of an upper mold and the second forming material layer is formed on a forming face of a lower mold. FIG. 11 is a cross-sectional view showing a state in which the first forming material layer and second forming material layer are stacked. FIG. 12 is a cross-sectional view showing a state in which an anisotropically conductive film is formed. FIG. 13 is a cross-sectional view showing a state in which a formed anisotropically conductive film is taken out from a metallic mold. FIG. 14 is a plan view showing a method of manufacturing a positioning member for the anisotropically conductive connector. FIG. 15 is a cross-sectional view of a method for manufacturing a positioning member for the anisotropically conductive connector. FIG. 16 is a perspective view of the anisotropically conductive connector. FIG. 17 is a perspective view showing expanded main portions of FIG. 16. FIG. 18 is a cross-sectional view showing the anisotropically conductive connector.

The anisotropically conductive connector 36 is made up of a rectangular anisotropically conductive film 65, an anisotropically conductive sheet 102 having a rectangular plate-like supporting body 66 to support the anisotropically conductive film 65, and a positioning member 103 formed integrally with the anisotropically conductive film 65, wherein the positioning member 103 is formed between the anisotropically conductive sheet 102 and electronic component 33.

First, the anisotropically conductive sheet 102 is described.

As shown well in FIGS. 6 and 7, in a central position of a supporting body 66 is formed a rectangular aperture 67 being smaller in dimension than an anisotropically conductive film 65 and in each of four corners of the supporting body 66 is formed a positioning hole 68. The anisotropically conductive film 65 is placed in the aperture 67 of the supporting body 66 and is secured to the supporting body 66 by securing of a peripheral edge portion of the anisotropically conductive film 65 to the supporting body 66.

The anisotropically conductive film 65 constituting the anisotropically conductive sheet includes a plurality of cylindrical conducting path forming parts 69 each extending in a direction of thickness and insulating portions 70 made of an insulating elastic polymeric substance which insulate the conducting path forming parts 69. Moreover, in a portion forming the conducting path forming portions 69 in the aniso-tropically conductive sheet 102 is contained conductive particles (not shown) exhibiting magnetism.

In the example shown in the drawings, a portion formed in a region except a peripheral edge portion in the anisotropically conductive film 65 out of a plurality of conducting path forming parts 69 serves as an effective conducting path forming part 71 to be electrically connected to an electrode portion 101 in an electronic component 33 being a data supply source or data writing object and a portion formed in the anisotropically conductive film 65 not to be electrically connected to the electrode portion 101 of the electronic component 33 serves as an ineffective conducting path forming part 72, wherein the effective conducting path forming part 71 is placed according to a pattern corresponding to a pattern of the electrode portion of the electronic component 33.

On the other hand, each of the insulating portions 70 is integrally formed so as to surround each of the conducting path forming parts 69 and, as a result, all the conducting paths are insulated from one another by the insulating portions 70.

One surface of the anisotropically conductive film 65 is a plane surface and on the other surface of the anisotropically conductive film 65 is formed a protruded portion 69a in which a surface of a portion forming its conducting path forming parts 69 protrudes from a surface of a portion forming the insulating portions 70.

As an elastic polymeric substance constituting the anisotropically conductive film 65, a polymeric substance having a bridged structure is preferable. As curable polymeric substance forming materials that can be used to obtain such an elastic polymeric substance, various kinds of substances can be applied, which includes a conjugated diene rubber such as a polybutadiene rubber, natural rubber, polyisoprene rubber, styrene-butadiene copolymer rubber, and hydrogenated substance thereof, block copolymer rubber such as styrene-butadiene-diene block copolymer rubber or styrene-isoprene block copolymer rubber, and hydrogenated substance thereof, and also includes chloroprene rubber, urethane rubber, polyester rubber, epichlorohydrin rubber, silicone rubber, ethylene-propylene rubber, ethylene-propylene-diene copolymer rubber.

When it is required that the obtained anisotropic sheet 102 has weather resistance, the use of materials other than conjugated diene rubber is preferable and, from a viewpoint of forming workability and electric properties, the use of silicone rubber is preferable. As silicone rubber to be used, rubber obtained by bridging and condensing a liquid silicone rubber is preferable. The viscosity of the liquid silicone rubber is preferably $10^5$ at a strain rate of less than $10^{-1}$ sec. and any liquid silicone rubber being of a condensation-type, of an addition type, or having a vinyl group or hydroxyl group can be employed. Specifically, the example of the liquid silicone rubber is dimethyl silicone raw rubber, methylvinyl silicone raw rubber, methylphenylvinyl silicone raw rubber, or the like.

It is preferable that a molecular weight Mw (standard polystyrene-converted weight average molecular weight, same thereafter) of silicone rubber is 10,000 to 40,000. Also, excellent heat resistance can be obtained from the obtained conducting path forming parts 69 and, therefore, an index of molecular weight distribution (rate of standard polystyrene-converted weight average molecular weight to rate of standard polystyrene-converted number average molecular weight, referred to as a value of Mw/Mn) is preferably less than 2.

As a conductive particle contained in the conducting path forming parts 69 in the anisotropically conductive film 65, a conductive particle exhibiting magnetism, since being easily oriented by using the method described later, is used. The specific examples of the conductive particles include metallic particles having magnetism such as iron, cobalt, nickel, or particles of alloy thereof, particles containing these metals, particles on the surface of which is plated with metal having excellent conductivity, particles using the above particles as a core particle and on the surface of the core particle of which is plated with metal having excellent conductivity such as gold, silver, palladium, rhodium, or the like, or particles using a nonmagnetic metallic particle as a core particle or using a non-organic substance particle such as a glass bead or a polymer particle as a core particle and on the surface of the core particle of which is plated with conductive magnetic metal such as nickel, cobalt, or the like.

Out of the particles described above, the use of a particle using a nickel particle as a core particle and on the surface of the core particle of which is plated with gold exhibiting excellent conductivity is preferable.

The method of coating the surface of the core particle with conductive metal is not limited to any special one and, for example, chemical plating method, electrolytic plating method, sputtering method, vapor deposition method, or the like may be employed.

When a particle on the surface of which is coated with conductive metal is used as a conductive particle, excellent conductivity can be obtained and, therefore, a coating rate (rate of an area coated with conductive metal to a surface area of a core particle) of conductive metal on the particle surface is preferably 40% or more, more preferably 45% or more, particularly preferably 47% to 95%.

An amount of coating with conductive metal amounts preferably to 0.5% to 50% by mass of the core particle, more preferably to 2% to 30% by mass of the core particle, further more preferably to 3% to 25% by mass, and particularly preferably 4% to 20% by mass. In the case in which conductive metal applied to conductive metal is gold, an amount of the coating is preferably 0.5% to 30% by mass of the core particle, more preferably 2% to 20% by mass, further more preferably 3% to 15% by mass.

A diameter of a conductive particle is preferably 1 µm to 100 µm, more preferably 2 µm to 50 µm, further more preferably 3 µm to 30 µm, and particularly preferably 4 µm to 20 µm. Moreover, a particle diameter distribution (Dw/Dn) of a conductive particle is preferably 1 to 10, more preferably 1.01 to 7, further preferably 1.05 to 5, particularly preferably 1.1 to 4.

By using the conductive particle that satisfies such conditions, the conducting path forming parts 69 that can be obtained become easily deformed by pressure and, in the conducting path forming parts 69, sufficient electrical contact can be achieved among conductive particles.

Moreover, a shape of a conductive particle is not limited to any special one, however, its shape is preferably spherical, star-like or of a aggregated secondary particle.

Furthermore, a conductive particle whose surface is treated with a coupling agent such as a silane coupling agent or with a lubricant may be used as appropriate. By treating a particle surface with the coupling agent or lubricant, durability of the anisotropically conductive sheet 102 is enhanced.

The polymeric substance forming material preferably contains 5% to 60% in volume percentage of such the conductive particle and more preferably 7% to 50%. If the volume percentage is less than 5%, in some cases, it is impossible for the conducting path forming parts 69 to have a sufficiently small electric resistance. On the other hand, if the volume percentage exceeds 60%, the conducting path forming parts 69 that can be obtained are weak thus causing it impossible to obtain elasticity required as the conducting path forming parts 69.

The conductive particle whose surface is coated with gold is preferably used as the conductive particle to be used in the conducting path forming parts 69. For example, if the electrode portion 101 of the electronic component 33 is made of plated alloy containing lead, the conductive particle contained on a side contacting with an electrode portion of an electronic component made of the plated alloy in the conducting path forming parts 69 is preferably coated with rhodium, palladium, ruthenium, tungsten, molybdenum, platinum, iridium, silver, diffusion-resistant metal selected from an alloy thereof, which prevents diffusion of a lead component into a coated layer in conductive particles.

The conductive particle having a surface coated with the diffusion-resistant metal can be formed by coating a surface of a core particle made of, for example, nickel, iron, cobalt, or alloy thereof with the diffusion-resistant metal by using an electrolytic plating method, sputtering method, vapor deposition method, or the like.

Moreover, the coating of the conductive particle can be achieved by using a plurality of metal layers and, when the diffusion-resistant metal is to be coated, a layer made of the diffusion-resistant metal such as rhodium is used as its outermost layer and a layer made of well conductive gold is used as an inner coated layer.

An amount of coating with a diffusion-resistant metal is preferably 5% to 40% in mass percentage to a conductive particle and more preferably 10% to 30%. A material with a linear thermal expansion coefficient of preferably $3 \times 10^{-5}$/k or less to be used as a material making up the supporting body 71, of more preferably $2 \times 10^{-5}$/k to $10^{-6}$/k, and particularly preferably $6 \times 10^{-6}$/k to $1 \times 10^{-8}$/k.

Specifically, a metallic material or non-metallic material is used as a material for the supporting body 71. Examples of the material include gold, silver, copper, nickel, cobalt or alloy thereof.

Examples of the non-metallic material include a resin material having mechanical strength such as a polyimide resin, polyester resin, polyaramide resin, polyamide resin, a composite resin material such as a glass fiber-reinforced epoxy resin, glass fiber-reinforced polyester, glass fiber-reinforced polyimide, and a composite resin material obtained by mixing an epoxy resin or the like with an inorganic material such as silica, alumina, boron nitride each serving as a filler. From a viewpoint that a thermal expansion coefficient is small, the composite resin material such as a polyimide resin, glass fiber-reinforced epoxy resin or the like or a composite resin material obtained by mixing an epoxy resin with boron nitride as a filler.

Such the anisotropically conductive sheet 102 can be fabricated by using, for example, the following metallic mold. FIG. 8 is a cross-sectional view showing configurations of one example of the metallic mold to be used for fabrication of the anisotropically conductive sheet 102 of the present invention. The metallic mold is made up of a pair of an upper mold 73 and a lower mold 74 each facing one another. Between a forming face of the upper mold (lower face in FIG. 8) and a forming face of the lower mold (upper face in FIG. 8), forming space 75 is formed.

In the upper mold 73, on a surface of a ferromagnetic substance substrate 76 (on a lower surface in FIG. 8) is formed a ferromagnetic substance layer according to a location pattern corresponding to a pattern of the conducting path forming parts 69 in an anisotropically conductive sheet 102 to be obtained and in portions other than the ferromagnetic substance layer 77 is formed a non-magnetic layer 78 having substantially the same thickness as that of the ferromagnetic substance layer 77.

On the other hand, in the lower mold 74, on a surface of the ferromagnetic substance substrate 79 (on the upper mold in FIG. 8) is formed a ferromagnetic substance layer 80 according to the pattern corresponding to a pattern of the conducting path forming parts 69 in the anisotropically conductive sheet and in portions other than the ferromagnetic substance layer 80 is a non-magnetic substance layer 81 being thicker than that of the ferromagnetic substance layer 80 and between the non-magnetic substance layer 81 having thickness larger than that of the ferromagnetic substance layer 80 and the ferromagnetic substance layer 80 is formed a step which causes a concave portion space 80a for the formation of a protruded portion 69e to be formed on a forming face of the lower mold 74.

Ferromagnetic metal such as iron, iron-nickel alloy, iron-cobalt alloy, nickel, cobalt can be used as a material for the ferromagnetic substance substrates 76 and 79. Thickness of each of these ferromagnetic substance substrates 76 and 79 is preferably 0.1 mm to 50 mm and it is preferable that its surface is smooth and a chemical degreasing treatment and mechanical polishing treatment are carried out on the ferromagnetic metal.

Ferromagnetic metal such as iron, iron-nickel alloy, iron-cobalt alloy, nickel, and cobalt can be used as a material for the ferromagnetic substance layers 77 and 80 in each of the upper and lower molds respectively. The thickness of each of the ferromagnetic substance layers 77 and 80 is preferably 10 μm or more. When the thickness is less than 10 μm or less, it is difficult to make a magnetic field having sufficient strength distribution act on a forming material layer formed in a metallic mold and, consequently, concentration of conductive particles at a high density in a portion that is to serve as the conducting path forming parts 69 in the forming material layer is made difficult and, as a result, an excellent anisotropically conductive sheet 102 cannot be obtained in some cases.

Non-magnetic metal such as copper or polymeric substance having thermal resistance can be used as a material for the non-magnetic substance layers 78 and 81 of the upper mold 73 and lower mold 74, however, from a viewpoint that the non-magnetic layers 78 and 81 can be easily formed photolithographically, the use of a polymeric substance cured by radiation is preferable and examples of the material for polymeric substance cured by radiation include a photo-resist such as an aclyl dry film resist, epoxy liquid resist, and polyimide liquid resist.

Also, the thickness of the non-magnetic substance layer 81 in the lower mold 74 is set depending on the height of the protrusion of the protruding portion 69a to be formed and on the thickness of the ferromagnetic substance layer 80. By using the above mold, for example, the anisotropically conductive sheet 102 can be manufactured in the following way.

First, as shown in FIG. 9, frame-like spacers 82a and 82b and the supporting body 66 having the aperture portion 67 and positioning hole 68 are provided and the supporting body 66 is secured to a specified position of the lower mold 74 with the spacer 82b interposed between the supporting body 66 and the lower mold 74 and, further, the frame-like spacer 82a is placed in the upper mold 73. On the other hand, by dispersing conductive particles exhibiting magnetism in the curable polymeric substance forming material, a paste-like forming material can be obtained.

Then, as shown in FIG. 10, by filling space formed by the spacer 82a on the forming face of the upper mold with a forming material, the first forming material layer 83a is formed and, on the other hand, by filling space formed by the lower mold 74, spacer 82b, and supporting body 86 with the forming material, the second forming material layer 83b is formed.

Next, as shown in FIG. 11, by placing the upper mold 73 on the supporting body 66 by a positioning step, the first forming material layer 83b is stacked on the second forming material layer 83b. Then, by activating an electromagnet (not shown) placed on an upper face of the ferromagnetic substrate layer 76 in the upper mold 73 and on a lower face of the ferromagnetic substance substrate 80 in the lower mold 74, a parallel magnet field having strength distribution, that is, the parallel magnet field having intense strength between the ferromagnetic substance layer 76 of the upper mold 73 and the ferromagnetic substance layer 80 of the lower mold corresponding to the ferromagnetic substance layer 76 is made to act in a direction of the first forming material layer 83a and second forming material layer 83b. As a result, in the first forming material layer 83a and second forming material layer 83b, conductive particles that have been dispersed in each of the forming layers are concentrated in portions that is to serve as the conducting path forming parts 69 placed between each of the ferromagnetic substance layers 77 of the upper mold and the ferromagnetic substance layers 80 of the lower mold corresponding to the ferromagnetic substance layers 77 and are oriented so as to align in a direction of thickness of each of the forming material layers.

Then, in this state, by performing a hardening process of each of the forming material layers, as shown in FIG. 12, the anisotropically conductive film 65 having the conducting path forming parts 69 being filled densely with conductive particles oriented so as to align in an elastic polymeric substance and the insulating portion 70 formed in a manner to surround these conducting path forming parts 69 and made of the insulating elastic polymeric substance containing not at all conductive particles or almost no conductive particles.

Then, by taking out the formed anisotropically conductive sheet 102 from a metallic mold, the anisotropically conductive sheet 102 shown in FIG. 13 is obtained.

The above hardening process for each of forming material layers can be performed with a parallel magnetic field being acted, however, may be performed even after the stopping of acts of the parallel magnetic field. The strength of the magnetic field acted on each of the forming material layers is preferably 20,000 μT to 1,000,000 μT.

Also, as a method for letting the parallel magnetic field act on each of the forming material layers, a permanent magnet instead of an electromagnet may be used. From a viewpoint that the strength of the parallel magnet field within the above range can be achieved, the use of a permanent magnet made of alnico (Fe—Al—Ni—Co) alloy, ferrite, or the like is preferable.

A type of the hardening process for each of the forming material layers is selected, as appropriate, depending on a material to be used, however, ordinarily, the hardening process is performed by a heating process. Predetermined heating temperature and heating temperature are determined as appropriate depending on a kind of polymeric substance forming material or the like constituting the forming material layers and on time required for movement of conductive particles, or the like.

Next, the positioning member 103 is described.

As shown in FIGS. 14 to 19, the positioning member 103 is made up of a grid-like perforated metallic member 105 in which a large number of holes 104 are formed in a location corresponding to the conducting path forming part 69 of the anisotropically conductive sheet 102 and an insulating layer 106 formed in a location surrounding the perforated metallic member 105 and in a location corresponding to the conducting path forming parts 69 of the positioning member 103 is formed an aperture portion 107.

To fabricate the positioning member 103 having the above configurations, an etching process is performed on a plate-like metallic member to form a large number of rectangular holes 104 in the metallic member and to form the grid-like perforated metallic member 105.

Next, the perforated metallic member 105 is placed in the forming mold 109. In the forming mold 109, a large number of concave portions are formed non-successively in a manner to correspond to the grid-like perforated metallic member 105 to be placed in the forming mold 109 and among these concave portions 108 are formed supporting portions 110 of the perforated metallic member 105. Then, the supporting portion 110 is preferably formed in a location, being at the farthest from a central of the hole 104, corresponding to an intersection portion of the perforated metallic member 105.

When the perforated metallic member 105 formed so that the intersection portion 111 is supported by the supporting portion 110 is placed on the forming mold 109 configured as above and in an upper portion of the concave portion 108, the perforated metallic member 105 is in a state being far upward from the concave portion 108, causing a clearance 112 to occur between the metallic member 105 and the concave portion 108. The mask 114 having a hole 113 in a location corresponding to the concave portion 108 is placed above the perforated metallic member 105 placed in the forming mold 109 and a liquid silicone rubber is made to flow into the concave portion 108 from the hole 13 of the mask 114 to form the insulating layer 106 in a portion surrounding the perforated metallic member 105. Thereafter, an insulating adhesive layer 115 using silicone rubber is further formed on the insulating layer 106, which causes the positioning member 103 having a great number of the apertures 107 to be manufactured.

Moreover, since the intersection portion 111 of the perforated metallic member 105 is supported by the supporting portion 110 of the forming mold 109 and the concave portion 108 is formed in a lower portion of the intersection portion 111, when the liquid silicone rubber is made to flow into the concave portion 108 from the hole 13 of the mask 114, the liquid silicone rubber does not go enough around the intersection portion 111 and the insulating layer 105 is formed in some cases. In this case, the above situation is preferably recovered by letting the liquid silicone rubber to be directly adhered to portions surrounding the intersection portion 111. However, even if a metallic portion of the intersection portion 111 is exposed, the intersection portion 111 is placed farthest from a central of the intersection portion 111 and, therefore, there is no danger of the occurrence of a short caused by contact between the metallic portion of the intersection portion 111 and an electrode portion 101 of electronic components 33 and the conducting path forming parts 69 of the anisotropically conductive sheet 102, as a result, presenting no problem in terms of safety.

Next, to fabricate the anisotropically conductive connector by the positioning member 103 and anisotropically conductive sheet 102, first, the positioning member 103 is placed on the anisotropically conductive sheet 102 so that the aperture 107 is in a position corresponding to the conducting path forming parts 69. Thereafter, with the positioning member 103 placed on the anisotropically conductive sheet 102, by heating the positioning member 103 and anisotropically conductive sheet 102 and by bonding the positioning member 103 to the anisotropically conductive sheet 102 with the insulating adhesive layer 115 obtained by dissolving the insulating layer 106 of the positioning member 103 and the insulating portion 70 of the anisotropically conductive sheet 10 to insulate the conducting path forming parts 69 from one another interposed between the positioning member 103 and anisotropically conductive sheet 102, the positioning member 103 is integrated with the anisotropically conductive sheet 102 to fabricate an anisotropically conductive connector 36.

Next, a method of inspecting an electronic component 33 using the inspecting apparatus and the converting adaptor 11 for the inspecting apparatus is described.

First, with the lid member 18 of the converting adaptor main body 13 being made open, the electronic component 33 to be inspected is placed in the electronic component holding member 17. The electronic component 33 is guided by the inclined face 34 into a specified position of space to be set on the anisotropically conductive connector 36. As shown in FIG. 19, an electrode portion 101 of the electronic component 33 is fitted into an aperture 107 of the positioning member 103 and the electrode portion 101 is guided into the conducting path forming parts 69 for being positioned, the electrode portion 101 of the electronic component 33 is reliably struck to and contacted with the anisotropically conductive sheet 102.

Next, when the momentum force of the torsion coil spring rotates the lid member 18 which covers an upper face of the base member 16, the stopping portion 45 of the hook member 42 is configured to stop the stop protruding portion 21 and the stopped state is held by the momentum force of the torsion coil spring 43. At this time point, the pressure-pushing member 19 moves downward as the lid member 18 rotates and the pressure-pushing portion 58 is guided into the space by the declined face of each of the electronic component holding portions to push, with pressure, the electronic component 33. At this time, since the compressing coil spring 55 is compressed between the stopper portion 48 and flange portion 53, the electronic component 33 pushes, with pressure, the anisotropically conductive sheet 102 at a predetermined pressure according to an amount of compression of the compressing coil spring 55. This causes electrical conduction between the electrode portion 101 of the electronic component 33 and the electrode portion 14 on the circuit substrate 12 with the conducting forming portion 69 of the anisotropically conductive sheet 102 being interposed therebetween.

In this state, when a current is applied to the circuit substrate 12 from power facilities on the inspecting apparatus side, the current flows into the electronic component 33 through the anisotropically conductive connector 36 and the electrode portion 101, this enabling specified electrical inspections on the electronic component 33.

The present invention is not limited to the embodiment described above and it is understood that modification and variation described below are possible without departing from the spirit and the scope of the invention.

(1) As shown in FIGS. 16 and 18, in the anisotropically conductive sheet 102, a step portion 137 may be formed in a portion surrounding the anisotropically conductive film 65 and to the step portion 137 may be attached the supporting body 66.

(2) The anisotropically conductive sheet 102 does not necessarily require the supporting body 66 and the anisotropically conductive sheet may be made up of the anisotropically conductive film 65 only.

(3) The lubricant may be applied on an upper surface or on both surfaces of the anisotropically conductive sheet. By applying the lubricant, durability of the anisotropically conductive sheet 102 at a time of electrical inspection can be improved.

(4) On the anisotropically conductive sheet 102 are placed the conducting path forming parts 69 at a constant pitch and part of the conducting path forming parts 69 may be used as the effective conducting path forming part 71 to be connected to the electrode portion 101 of the electronic component 33 and other remaining conducting path forming parts 69 may be used as the ineffective conducting path forming part 72 not to be connected to the electrode portion 101 of the electronic component 33. More specifically, in some of electronic components 33, for example, in a CSP (Chip Scale Package) or TSOP (Thin Small Outline Package), a solder ball electrode serving as an electrode portion is formed in part of the location out of positions formed at a constant pitch and, in the anisotropically conductive sheet 102 to be used in such the electronic components 33 for electrical inspection, the conducting path forming parts 69 may be placed in a grid-point position at a pitch being substantially the same as that of the electrode portion 101 of the electronic component 33 and the conducting path forming parts 69 placed at a position corresponding to the electrode portion may be used as the effective conducting path forming part and the conducting path forming parts 69 other than the above may be used as the ineffective conducting path forming part.

In the anisotropically conductive sheet 102 having the configurations described above, at a time of fabrication of the anisotropically conductive sheet 102, the ferromagnetic layer of the metallic mold is placed at a constant pitch and, therefore, when a magnetic field is made to act on the forming material layer, conductive particles can be effectively gathered and oriented at a specified position, which makes density of the conductive particles uniform in each of the conducting path forming parts 69 to be obtained and, therefore, the anisotropically conductive sheet 102 having a small difference in a resistance value of the conducting path forming parts 69 can be obtained.

(5) The anisotropically conductive sheet 102 may contain a reinforced structural member. As the reinforced structural member, a mesh or unwoven fabric may be suitably used. By letting such the reinforced structural member be contained in the conductive film 65, even when the anisotropically conductive sheet 102 is pressed repeatedly by the electrode portion 101 of the electronic component 33, the deformation of the conducting path forming parts 69 is suppressed further and, therefore, more stable conductivity can be obtained for a long period.

A material made of an organic fiber can be suitably used as a mesh or unwoven fabric making up the reinforced structural member. The example of the organic fiber include a fluororesin fiber such as a polytetrafluoroethylene fiber, aramide fiber, polyethylene fiber, poly-allylate fiber, nilyon fiber, polyester fiber, liquid crystal polymer fiber, or the like.

By using the organic fiber whose linear thermal expansion coefficient is the same as or near to that of a material forming an object to be connected, more specifically, the organic fiber whose linear thermal expansion coefficient is $3 \times 10^{-5}$/K to $5 \times 10^{-6}$/K, particularly, $1 \times 10^{-5}$/K to $3 \times 10^{-5}$/K, the thermal expansion is suppressed and, even when the anisotropically conductive sheet is influenced by the thermal history caused by a change in temperature, an excellent electrically connected state to an object to be connected can be stably maintained. Also, it is preferable to use the organic fiber whose diameter is 10 μm to 200 μm.

(6) The anisotropically conductive film 65 may not contain the conducting path forming parts 69 and insulating portion 70 and its conductive particles may disperse in a plane direction and be oriented in a direction of thickness. Such the anisotropically conductive film 65 can be fabricated by using the method disclosed in the Japanese Patent Publication No. 2003-77560.

(7) The electronic component 33 is not limited to specified types and the electronic components 33 of various types may be used. The examples of the electronic component 33 include an active component such as a transistor, diode, relay, switch, semiconductor such as an IC chip, LSI chip, packages thereof, MCM (Multi Chip Module), a passive component such as a resistor, capacitor, quartz oscillator, speaker, microphone, transformer, inductor, display panel such as a TFT (Thin Film Transistor) liquid crystal display panel, STN (Supertwist Nematic) liquid crystal display panel, plasma display panel, and electroluminescent panel.

(8) The application of the anisotropically conductive connector 36 of the present invention is not limited to the inspection using the inspecting apparatus equipped with the converting adaptor 11 described above. For example, as shown in FIG. 20, by inserting a guide pin 122 for inspection into a positioning hole 68 of the supporting body 66 of the anisotropically conductive connector 36, which is positioned and placed on the circuit substrate 121 and on the anisotropically conductive connector 36 is placed an electronic component to be inspected to perform the testing of durability.

In the inspection of durability, with the anisotropically conductive connector 36 placed in a thermostat 123, a predetermined load is applied to the electronic component 33 to be inspected by using a pressurizing jig (not shown) and, during the application of pressure, a constant current is applied repeatedly to measure an electrical resistance value and to repeat the pressuring cycle to perform evaluation of the anisotropically conductive connector. To measure an electrical resistance value, while a direct current is ordinarily applied by a direct current power source 125 and a constant current controlling device 126 among the anisotropically conductive connector 36, inspection electrode portion 124 of the electronic component 33 to be inspected and the inspection circuit substrate 121 and external terminals (not shown) of the inspection circuit substrate 121 connected to one another via the wiring (not shown), a voltage occurring at the application of pressure across external terminals of the inspection circuit substrate 121 is measured by using a voltmeter 125.

(9) As shown in FIGS. 21 to 23, by inserting the guide pin of the inspection circuit substrate 131 into the positioning hole 68 of the supporting body 66 of the anisotropically conductive connector 36 which is placed on the inspection circuit substrate 131 and, with the inspection electrode portion 133 of the inspection circuit substrate 131 being connected to the conducting path forming parts 69 of the anisotropically conductive sheet 102, an electronic component 136 to be inspected is carried on the anisotropically conductive connector 36 by a carrier 134 to perform automatic inspections.

FIG. 21 is a diagram used to explain a state before a subject to be inspected 136 is carried by the carrier 134 and is set on the anisotropically conductive connector 36 in another inspecting apparatus equipped with an anisotropically conductive connector of the embodiment of the present invention. FIG. 22 is a diagram used to explain a state in which a subject to be inspected having been carried by the carrier 134 is set on the anisotropically conductive connector 36 in the above inspecting apparatus.

As shown in FIG. 22, in a state in which the electronic component 36 has been set on the anisotropically conductive sheet 36, the carrier 134 is moved downward and a subject to be inspected 136 is moved apart from the carrier 136 and is stacked on the anisotropically conductive connector 36. By fitting each of the electrode portions 135 protruded from the subject to be inspected into the aperture portion 107, the electrode portions of the positioning member 103 of the anisotropically conductive connector 36 are correctly positioned on the conducting path forming parts 69 of the anisotropically conductive connector 36.

Then, the subject to be inspected is pushed with pressure downward by the pressure-pushing means (not shown) and, as a result, the subject to be inspected 136 is made to be electrically connected with the inspection circuit substrate 131 to perform electrical inspections.

The subject to be inspected 136 after the inspections, as shown in FIG. 23, is released from the pressure-pushing means and is taken out upward from the anisotropically conductive connector 36 and is carried by the carrier 134.

When the above operation is performed continuously, if the subject to be inspected 136 is not placed in a correct position on the anisotropically conductive connector, electrical connection between the inspection circuit substrate 131 and the subject to be inspected cannot be achieved and, as a result, there is a fear of an inexact inspection result showing that the conforming subject to be inspected is judged as the nonconforming product.

When the subject to be inspected 136 is carried successively and the inspections are performed continuously as described above, in the case of the conventional anisotropically conductive connector obtained by stacking the positioning insulating sheet 5 on the anisotropically conductive sheet 2, positioning accuracy of the aperture portion 4 formed on the insulating sheet 5 is lower than that of the positioning member 103 having the metallic member of the present invention and, therefore, high-accurate positioning is difficult and no exact result can be obtained in the inspection of the subject to be inspected 136 having the protruded electrode portions 135 formed at a fine pitch and in high density.

Also, when the subject to be inspected 136 is carried by using the carrier 134, a nail of the carrier 134 is made to move forward into a lower portion of the subject to be inspected 136 which is put on the nail and, at a time of the inspection, the nail of the carrier 134 is moved downward to stack the subject to be inspected 136 on the anisotropically conductive connector 36 and, therefore, space for moving the nail of the carrier 134 downward is required. For example, the diameter of the solder protruded electrode portion placed at about 200 μm pitch is 100 μm and its height is about 50 μm and it is required that a thickness of the nail of the carrier 134 is about 50 μm or more. Accordingly, in the anisotropically conductive connector 36, space having 200 μm or more is required so as to achieve forward movement. However, the conventional method described in FIG. 23 presents a problem in that the insulating sheet 5 for positioning is secured by a guide pin and, as a result, securing of space for moving the carrier 134 downward is difficult and the conventional method cannot be applied to the successive inspection.

Moreover, another method is envisioned that the insulating sheet for positioning is stacked on the anisotropically conductive connector 36 and the positioning film is not fixed by the guide pin, however, in such the method, while several hundreds of the subjects to be inspected 136 are continuously inspected for one hour, the insulating sheet for positioning is peeled from the anisotropically conductive connector 36 and the subjects to be inspected 136 are carried with the insulating sheet being adhered and troubles occur in the inspecting apparatus in some cases.

The positioning member 103 of the embodiment of the present invention, unlike the conventional positioning member, owing to its high positional accuracy, is able to position a subject to be inspected 136 having electrode portions 135 formed at a fine pitch and protruded in high density in an exact place. As a result, even in the successive inspections performed by using the carrier 134 with high throughput (high speed processing) of about several hundreds of the subjects to be inspected 136 for one hour, few inspection troubles caused by peeling-off of the positioning member 103 occur and inspection costs can be reduced.

Also, in this case, as shown in FIG. 16, by using the anisotropically conductive sheet 102 having the step portion 137 formed in the region surrounding the anisotropically conductive film 65, the effective conducting path forming part can be formed even in the region surrounding the anisotropically conductive film 65 and the positioning member 103 can be formed integrally with the anisotropically conductive sheet 102 only in portions being contact with the subject to be inspected. Moreover, by forming the step portion 137 in the anisotropically conductive film 65, space for entrance of the carrier 134 can be secured sufficiently. Therefore, even in the fine subjects to be inspected in which their electrode portions 135 are formed in locations near to the peripheral edge portion, successive electrical inspections can be performed reliably.

EXPLANATION OF LETTERS OR NUMERALS

Figure 1:
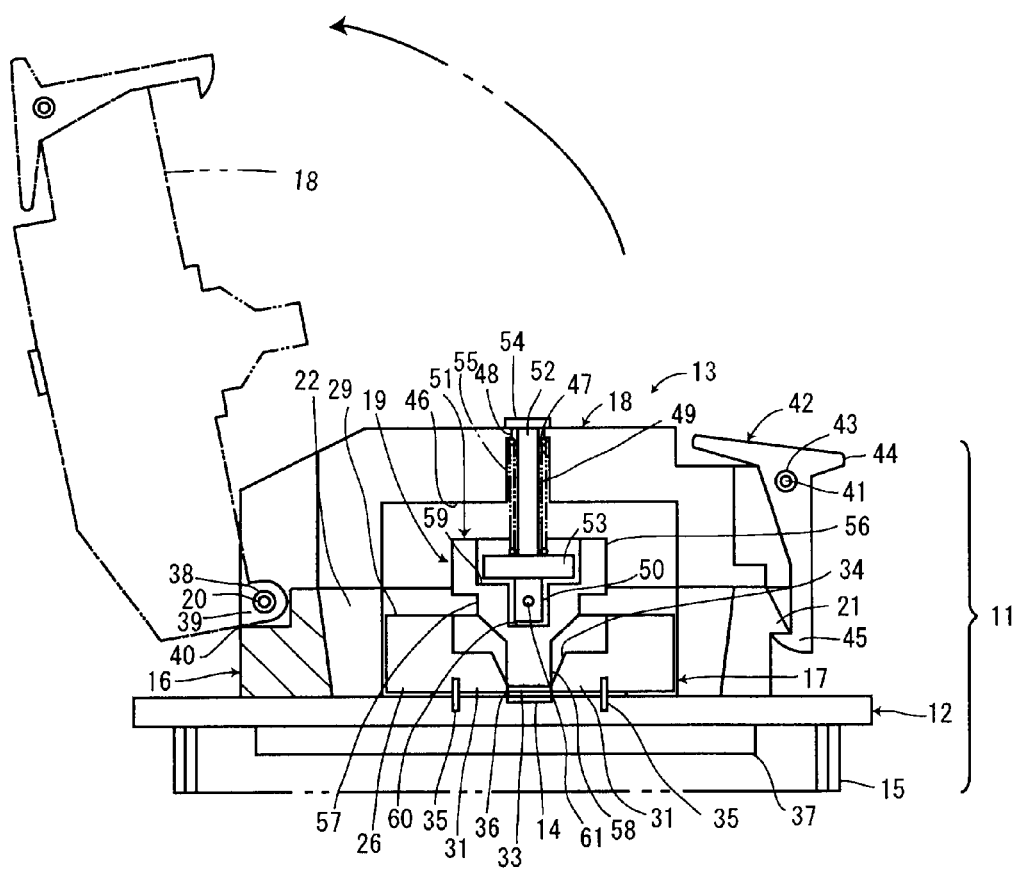
FIG. 1 is a cross-sectional view showing a converting adaptor for an inspecting apparatus according to an embodiment of the present invention.
Figure 2:
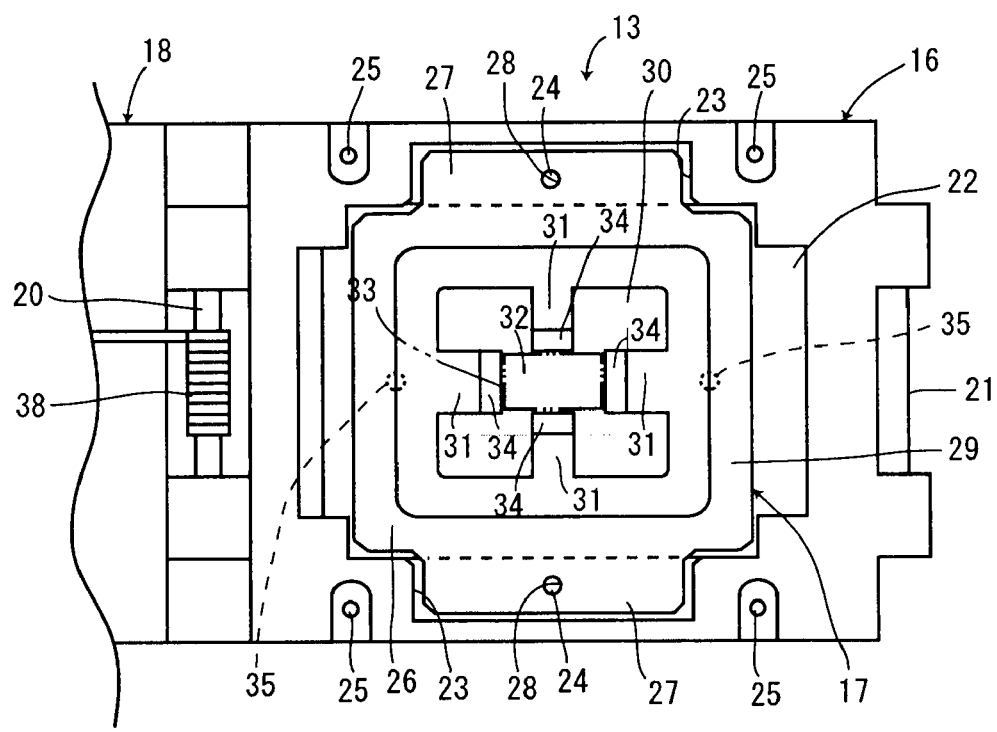
FIG. 2 is a plan view showing the converting adaptor for the inspecting apparatus according to the embodiment of the present invention.
Figure 3:
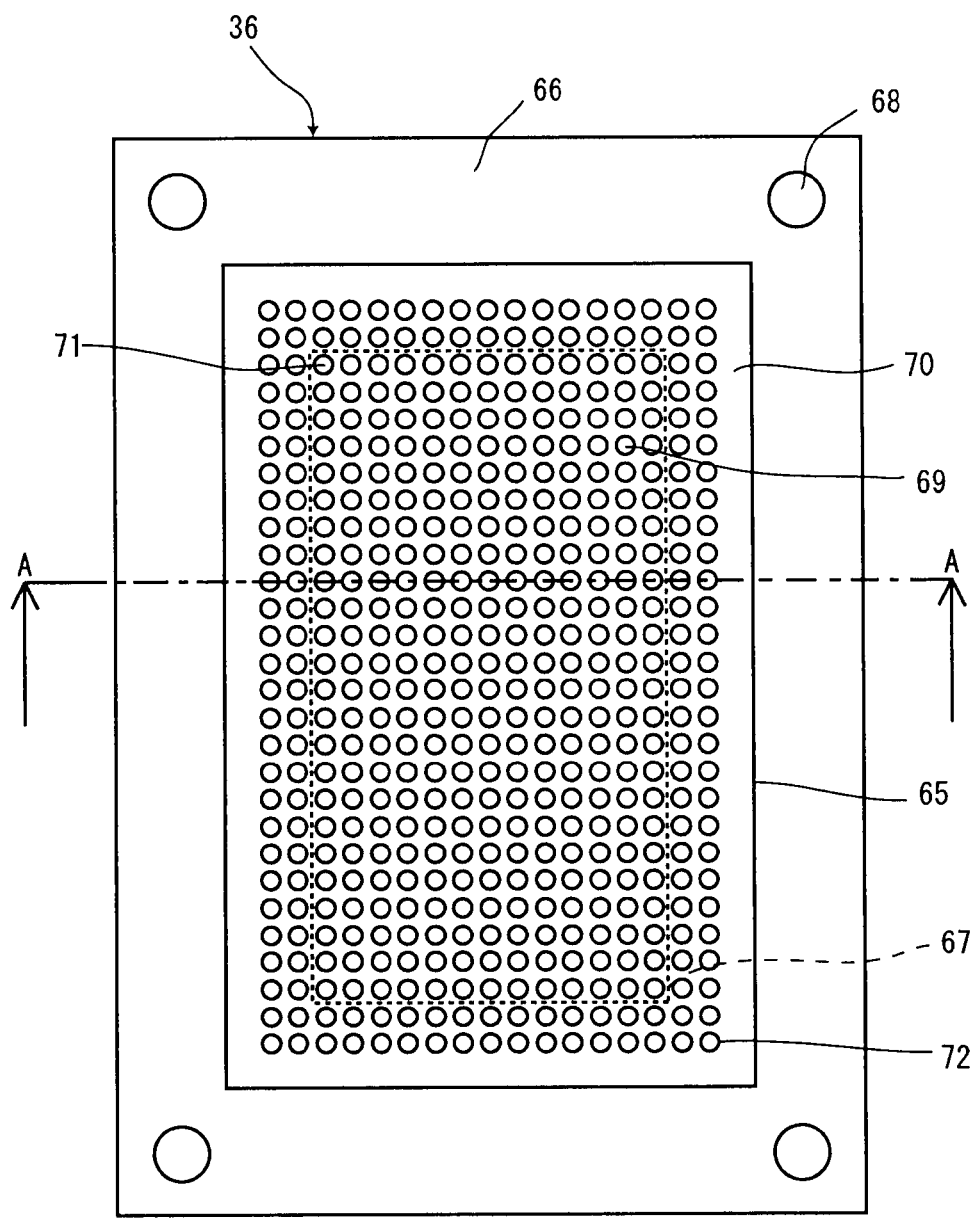
FIG. 3 is a plan view showing an anisotropically conductive connector according to the embodiment of the present invention.
Figure 4:
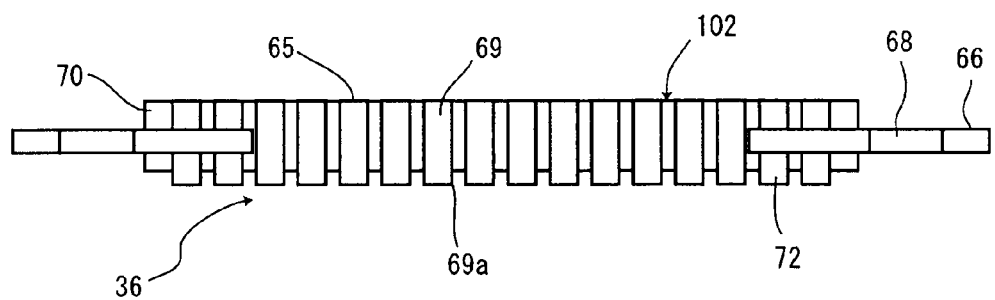
FIG. 4 is a cross-sectional view of the anisotropically conductive sheet of FIG. 3 taken along the line A-A.
Figure 5:
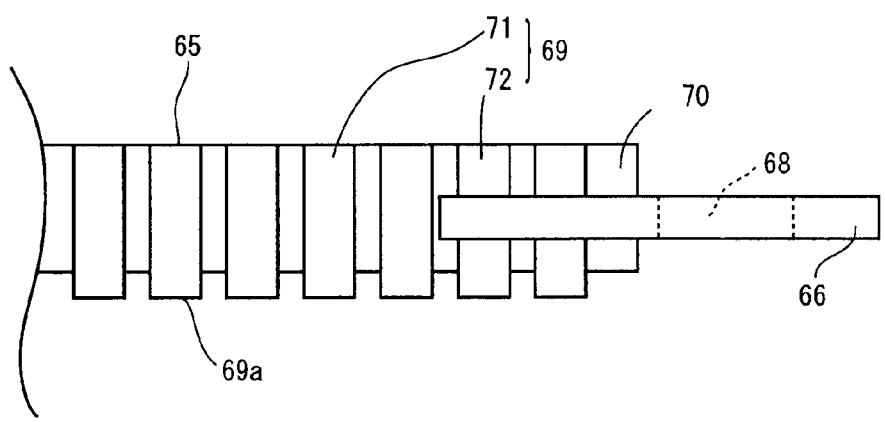
FIG. 5 is a partially expanded cross-sectional view of the anisotropically conductive sheet of FIG. 4.
Figure 6:
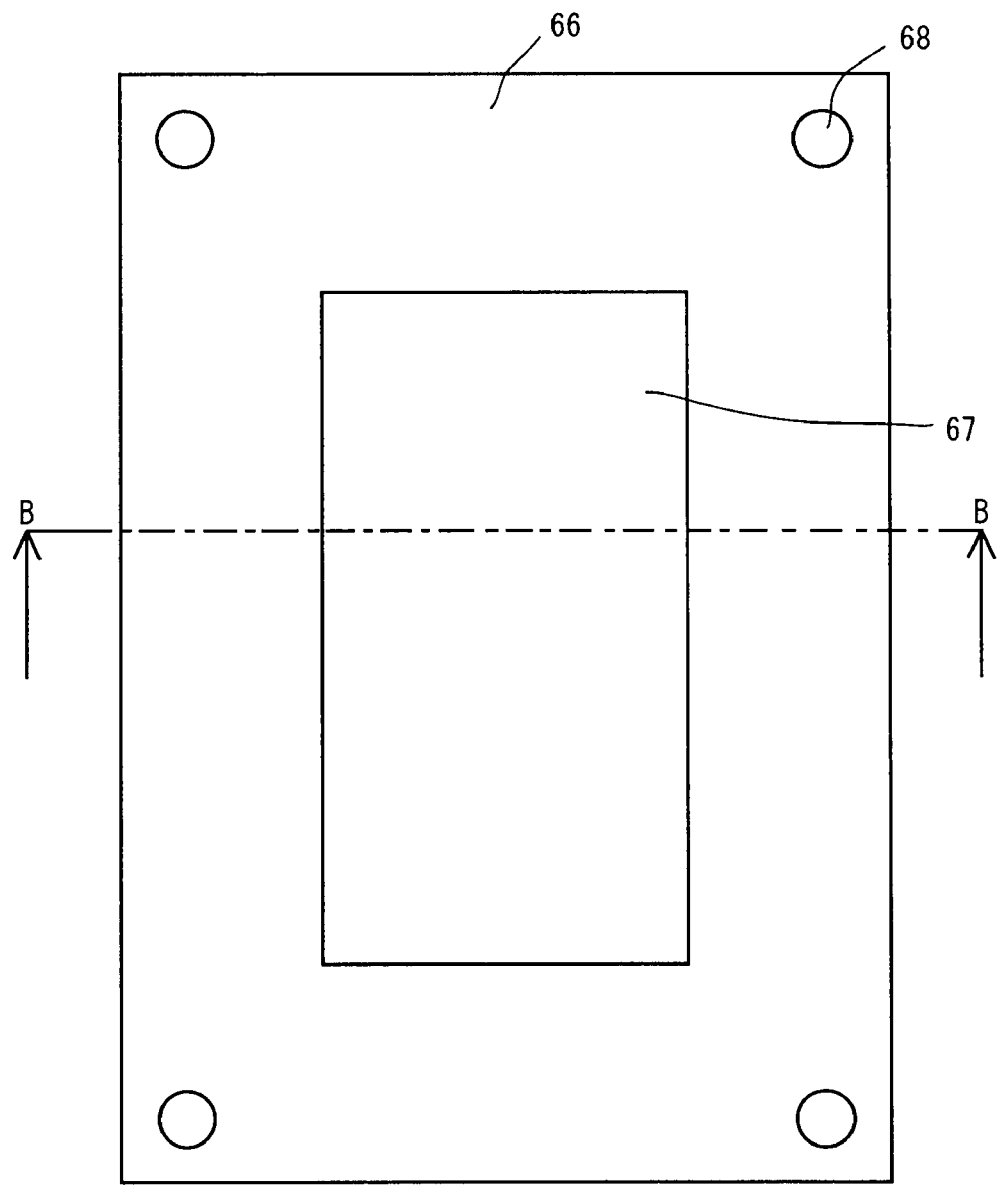
FIG. 6 is a plan view showing a supporting body of the anisotropically conductive sheet according to the embodiment of the present invention.
Figure 7:
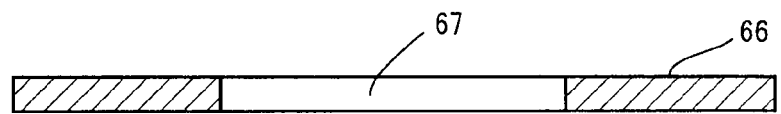
FIG. 7 is a cross-sectional view of the anisotropically conductive sheet of FIG. 6 taken along the line B-B.
Figure 8:
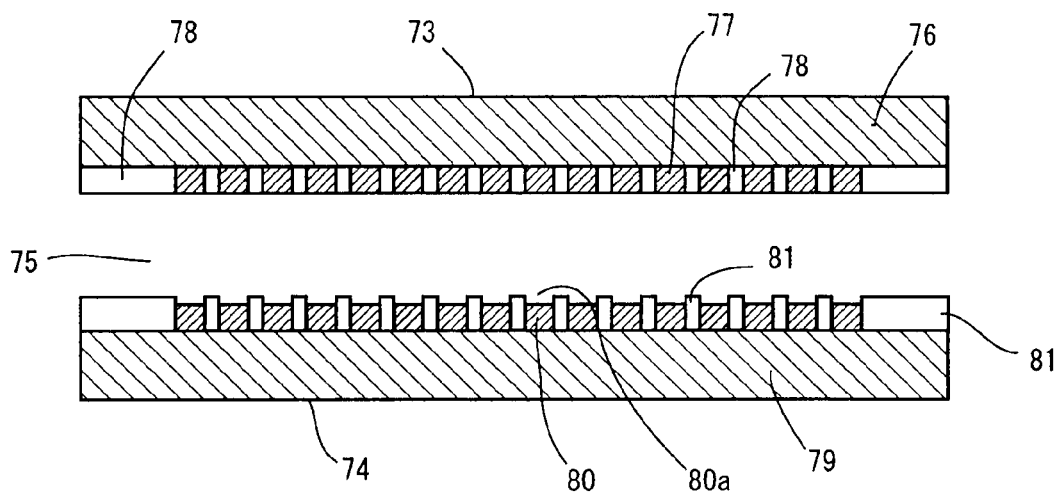
FIG. 8 is a cross-sectional view of a metallic mold for formation of an anisotropically conductive film according to the embodiment of the present invention.
Figure 9:
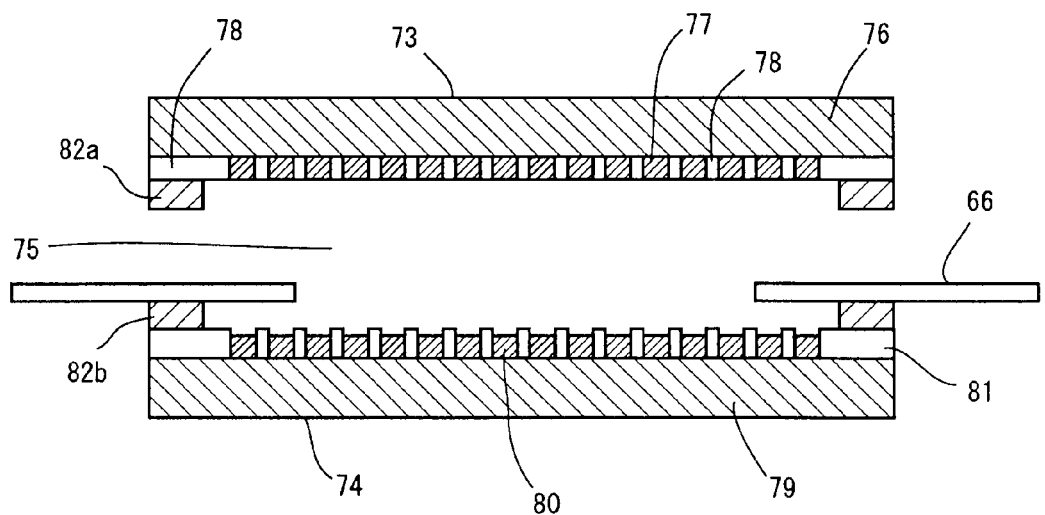
FIG. 9 is a cross-sectional view showing a state in which a spacer and a supporting body on a forming face of a lower mold according to the embodiment of the present invention.
Figure 10:
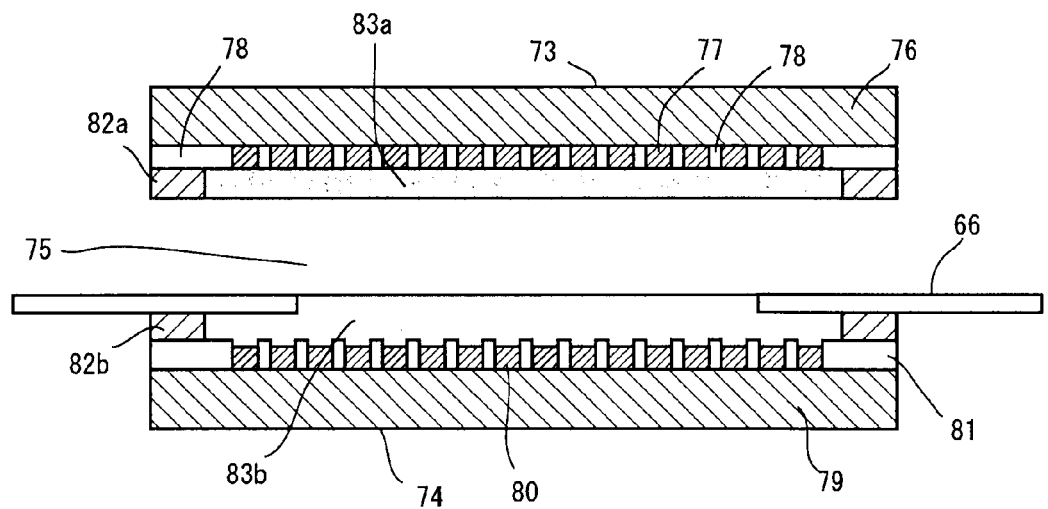
FIG. 10 is a cross-sectional view showing a state in which the first forming material layer is formed on a forming face of an upper mold and the second forming material layer is formed on a forming face of a lower mold according to the embodiment of the present invention.
Figure 11:
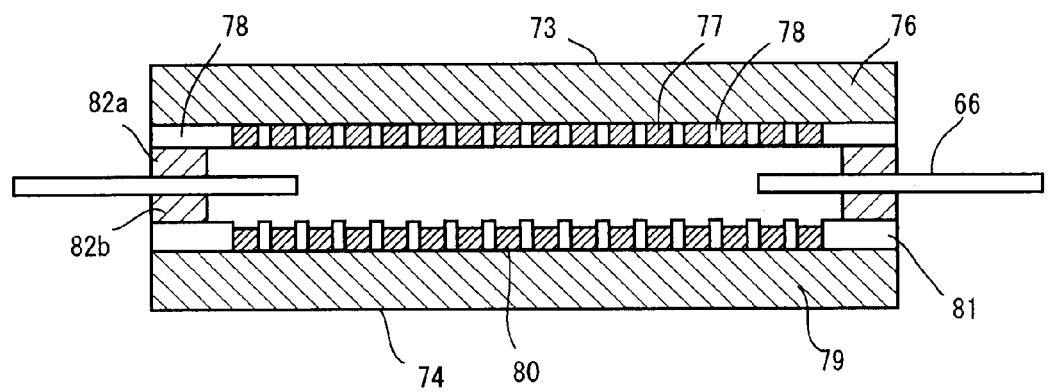
FIG. 11 is a cross-sectional view showing a state in which the first forming material layer and second forming material layer are stacked according to the embodiment of the present invention.
Figure 12:
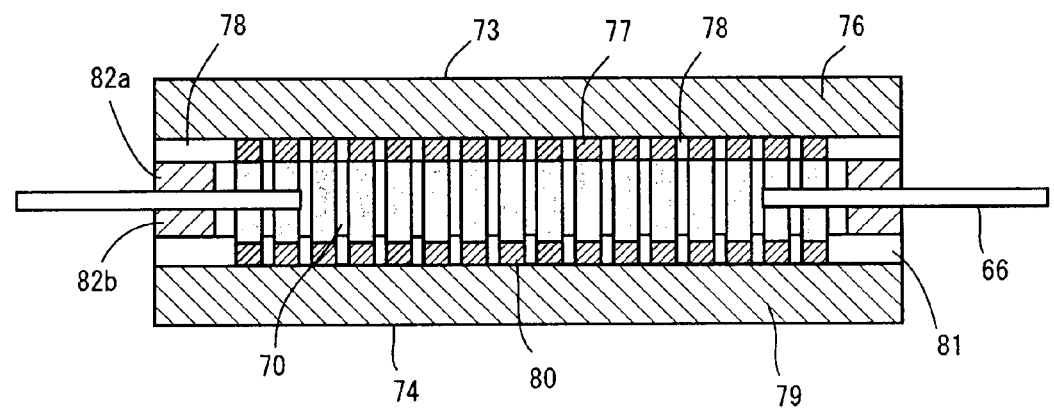
FIG. 12 is a cross-sectional view showing a state in which an anisotropic conductive film is formed according to the embodiment of the present invention.
Figure 13:
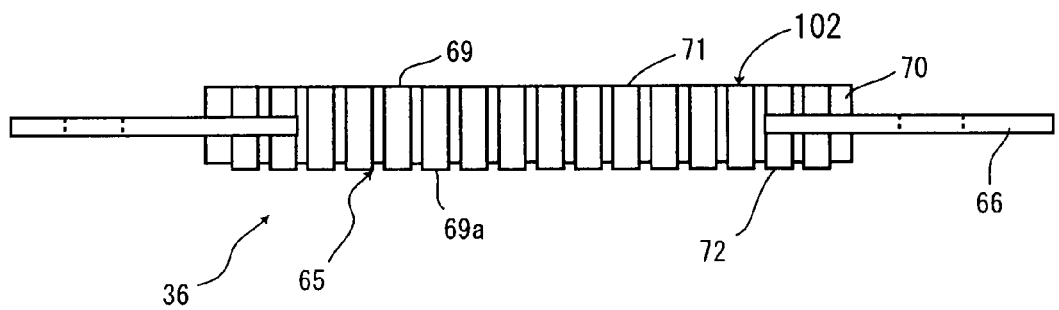
FIG. 13 is a cross-sectional view showing a state in which a formed anisotropically conductive film is taken out from a metallic mold according to the embodiment of the present invention.
Figure 14:
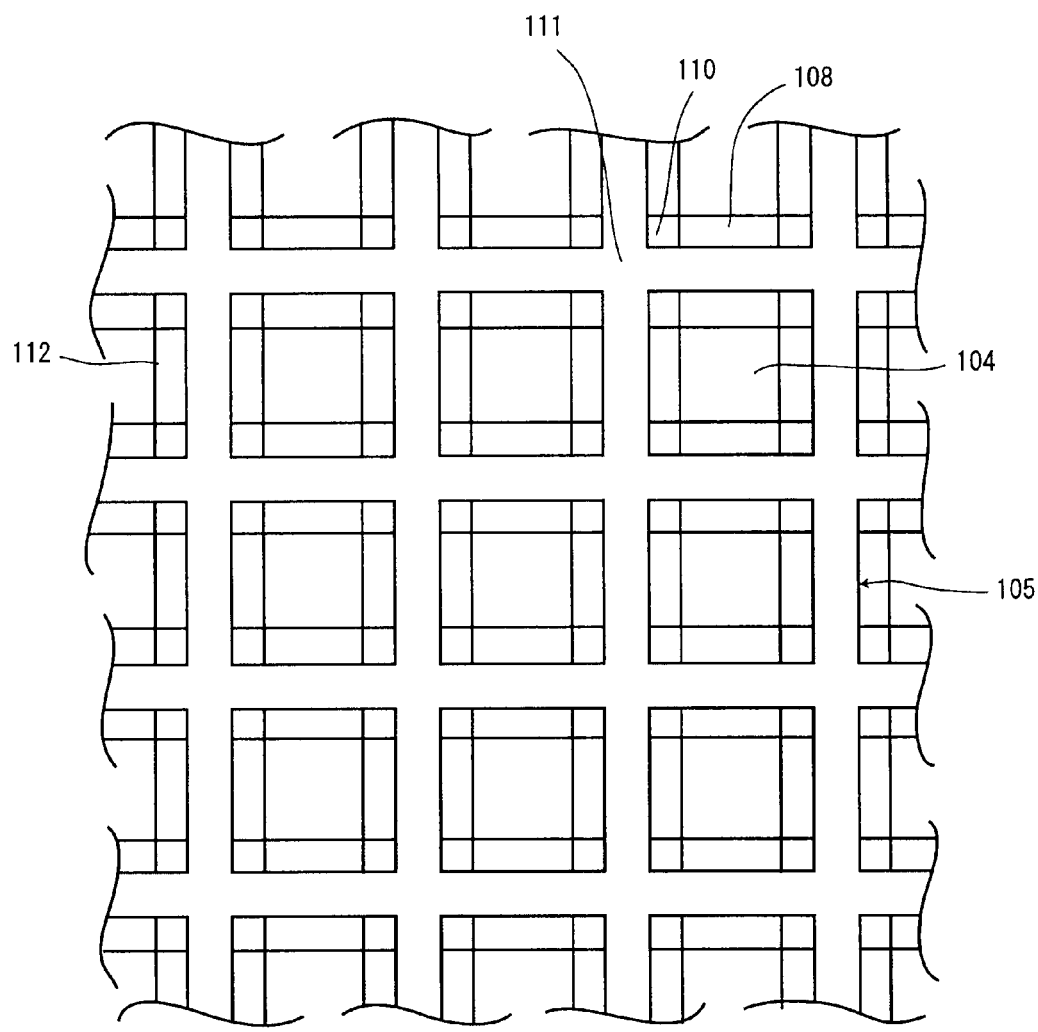
FIG. 14 is a plan view showing a method of manufacturing a positioning member for the anisotropically conductive connector according to the embodiment of the present invention.
Figure 15:
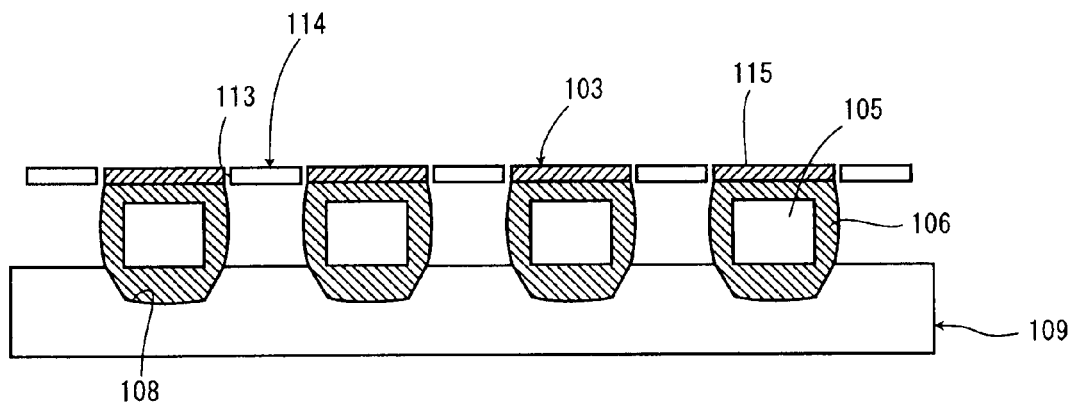
FIG. 15 is a cross-sectional view of a method for manufacturing a positioning member for the anisotropically conductive connector according to the embodiment of the present invention.
Figure 16:
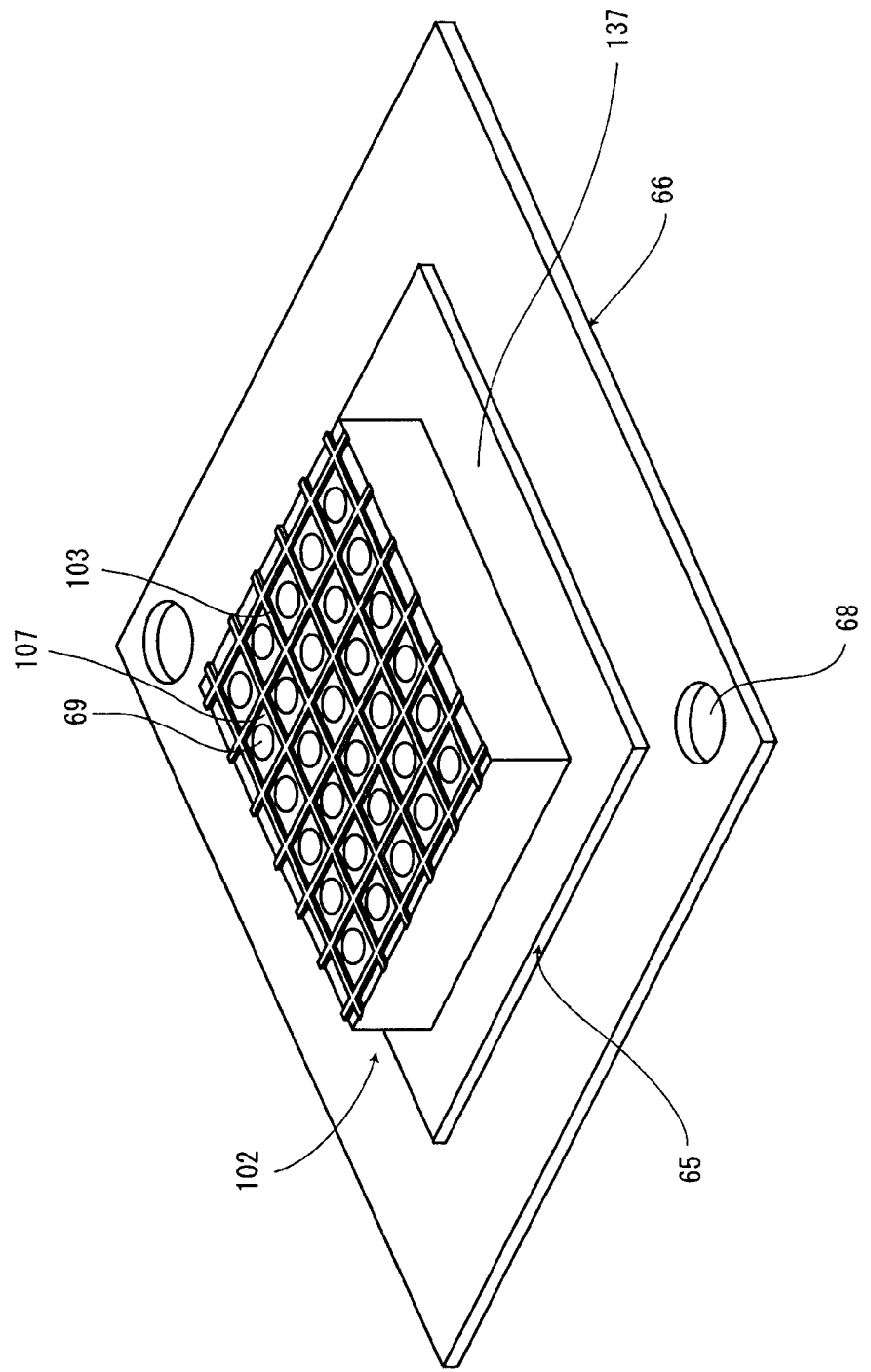
FIG. 16 is a perspective view of the anisotropically conductive connector according to the embodiment of the present invention.
Figure 17:
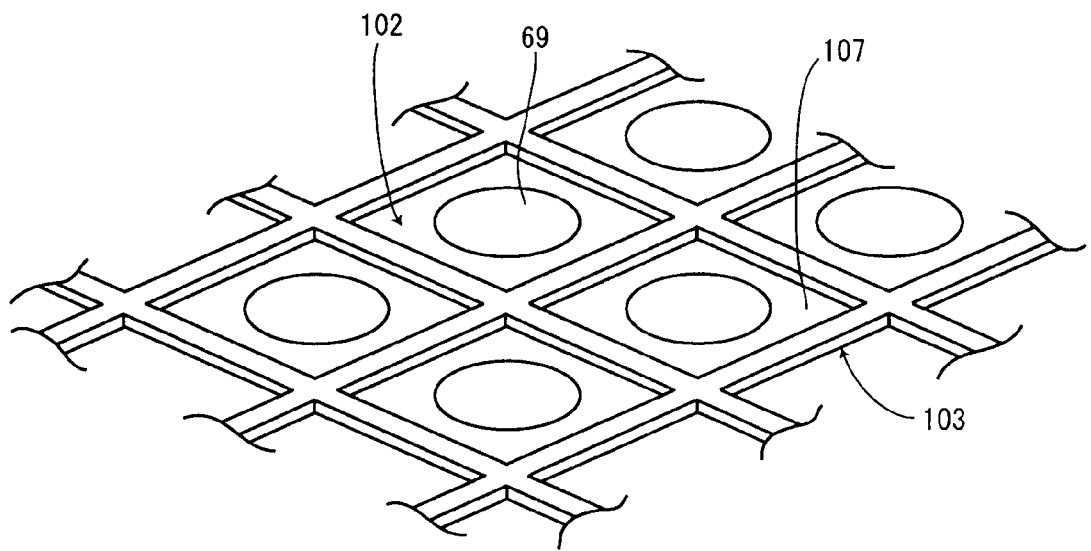
FIG. 17 is a perspective view showing expanded main portions of FIG. 16.
Figure 18:
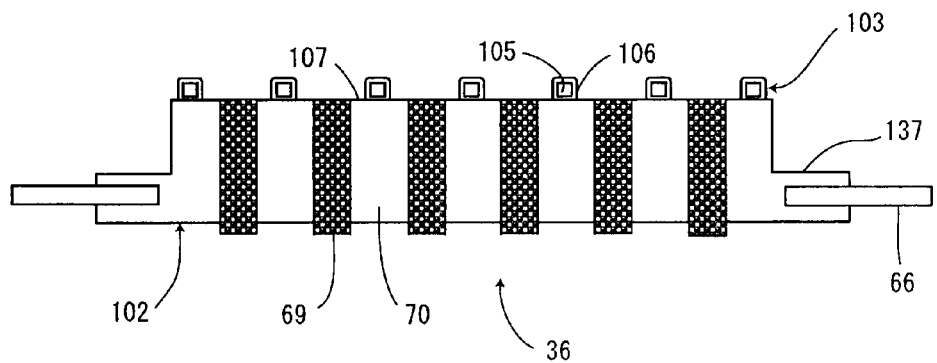
FIG. 18 is a cross-sectional view showing the anisotropically conductive connector according to the embodiment of the present invention.
Figure 19:
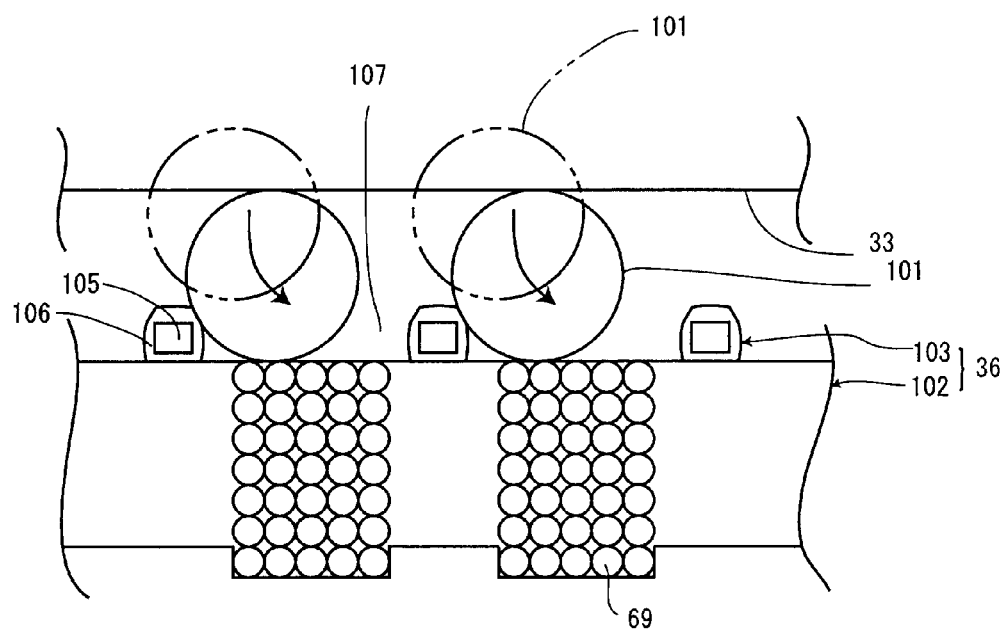
FIG. 19 is a diagram used to explain an action of the anisotropically conductive connector according to the embodiment of the present invention.
Figure 20:
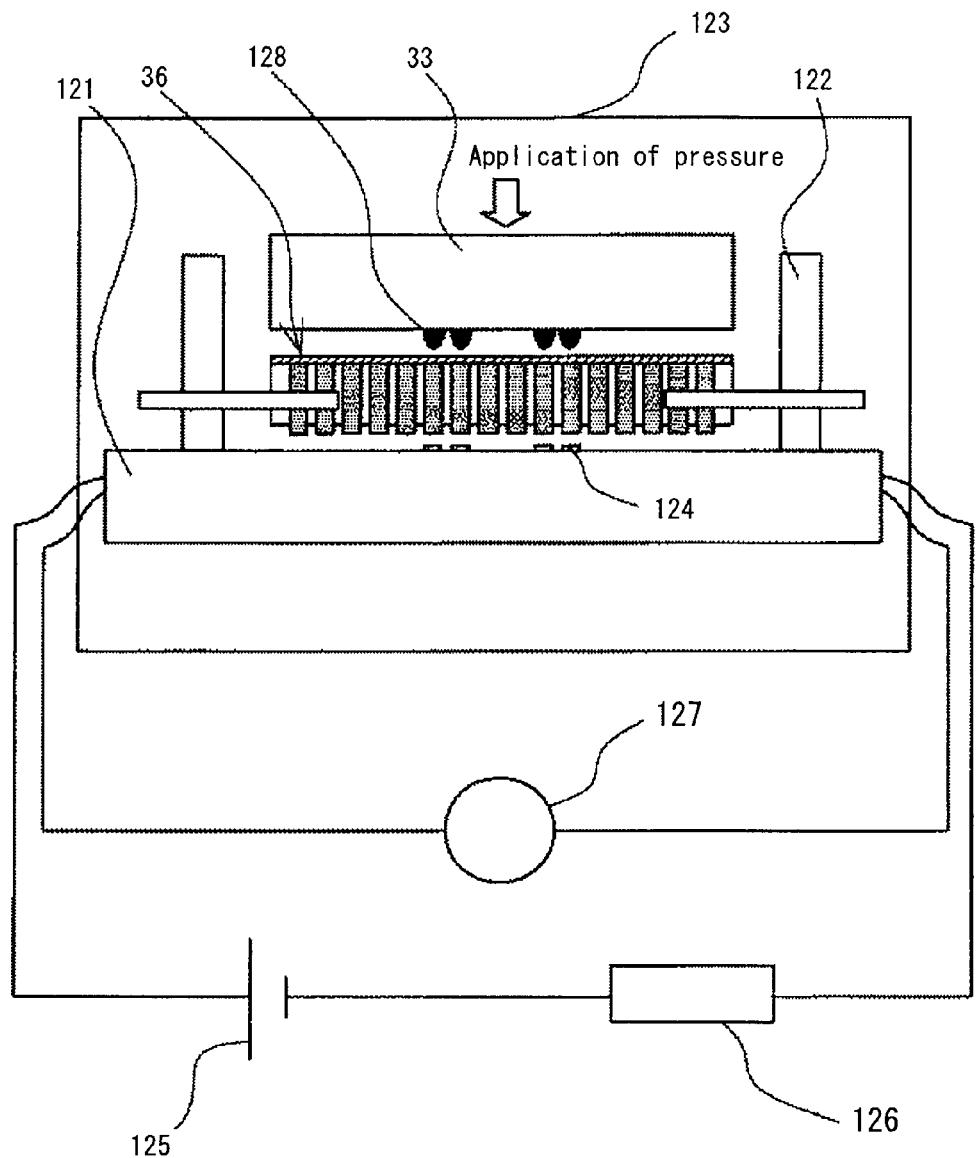
FIG. 20 is a diagram used to explain another example of the inspecting apparatus equipped with the anisotropically conductive connector according to the embodiment of the present invention.
Figure 21:
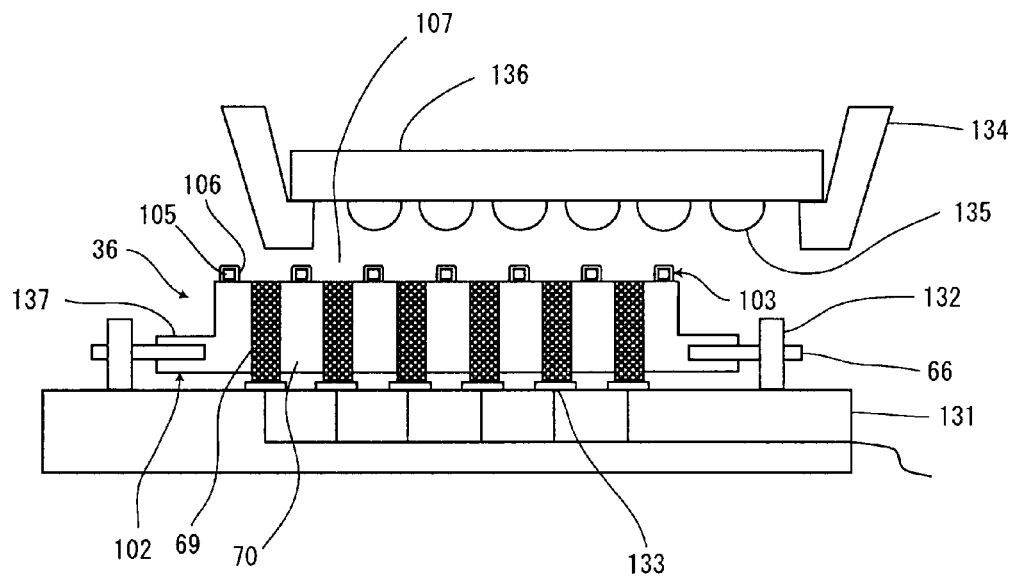
FIG. 21 is a diagram used to explain a state before inspection in still another inspecting apparatus equipped with the anisotropically conductive connector according to the embodiment of the present invention.
Figure 22:
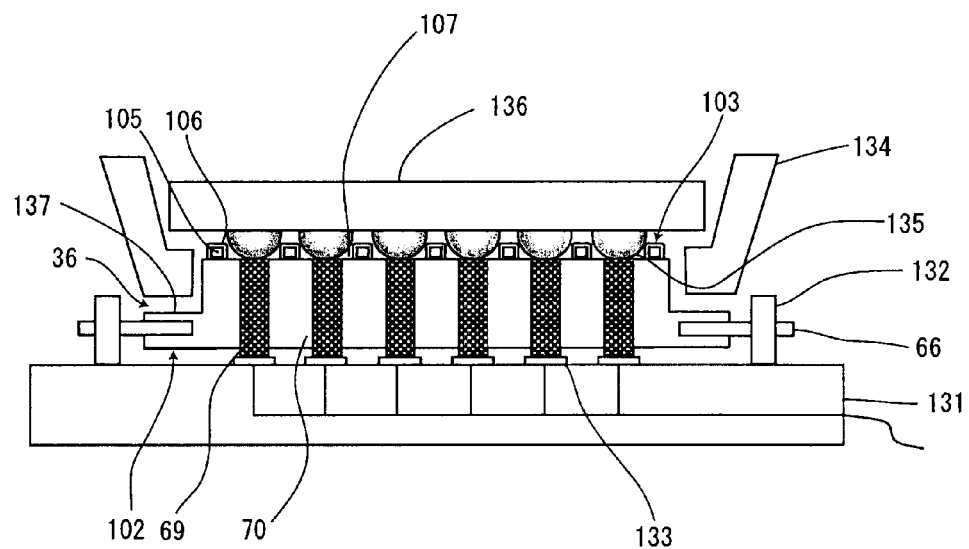
FIG. 22 is a diagram used to explain a state at a time of inspection in still another inspecting apparatus equipped with the anisotropically conductive connector according to the embodiment of the present invention.
Figure 23:
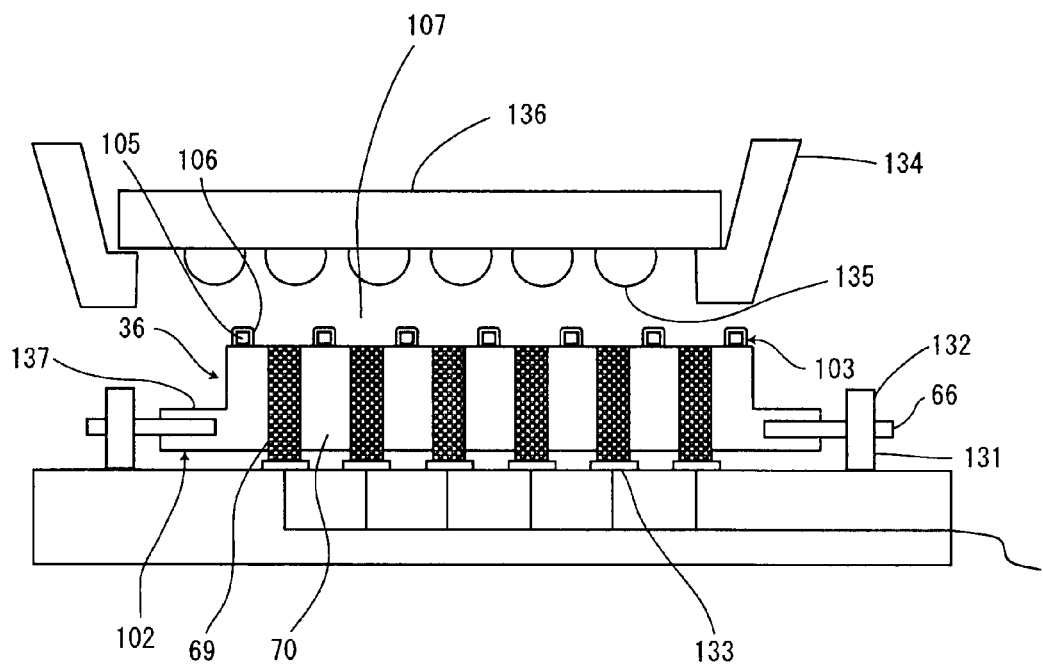
FIG. 23 is a diagram used to explain a state after inspection in still another inspecting apparatus equipped with the anisotropically conductive connector according to the embodiment of the present invention.
Figure 24:
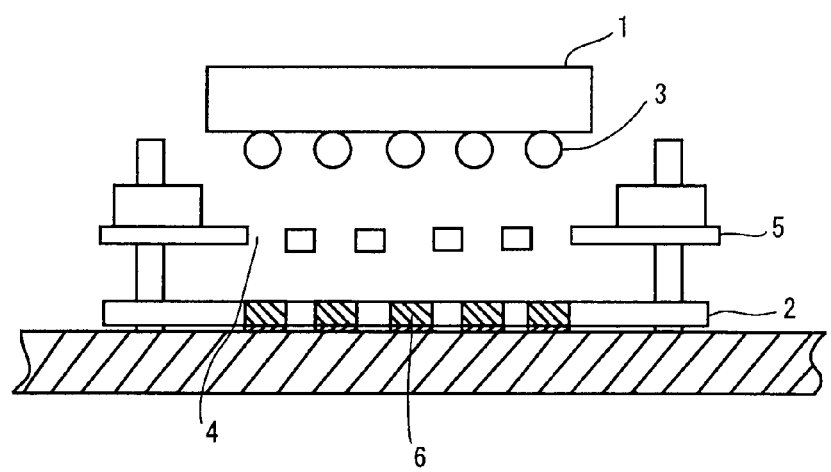
FIG. 24 is a cross-sectional view showing a conventional converting adaptor.

11: Converting adaptor for inspecting apparatus, 12: Circuit substrate, 14: Electrode portion, 36: Anisotropically conductive connector, 33: Electronic component, 36: Anisotropically conductive connector, 69: Conducting path forming parts, 70: Insulating portion, 101: Electrode portion, 102: Anisotropically conductive sheet, 103: Positioning member, 104: Hole, 105: Perforated metallic member, 106: Insulating layer, 107: Aperture portion, 108: Concave portion, 109: Forming mold, 113: Hole, 114: Mask, 121: Circuit substrate for inspection, 124: Electrode portion for inspection, 128: Solder hall electrode portion, 131: Substrate for inspection, 133: Electrode portion for inspection, 135: Electrode portion

The invention claimed is:

1. An anisotropically conductive connector connected, to electrically connect an electronic component being a subject to be inspected having a protruded electrode portion with a circuit substrate for inspections having an electrode for inspection, between an electrode portion of said electronic component and an electrode portion for inspection of said circuit substrate for inspection, comprising:

an anisotropically conductive sheet having an anisotropically conductive film comprising conducting path forming parts to electrically connect an electrode portion of said electrical component with an electrode portion for inspection of said circuit substrate for inspection and an insulating portion to insulate said conducting path forming parts from one another;

a positioning member placed between said anisotropically conductive sheet and said electronic component having an aperture portion formed at a position corresponding to each of said conducting path forming parts; and wherein said positioning member comprising an insulating layer formed in a portion surrounding a perforated metallic member and when an electrode portion of said electronic component is fitted into an aperture portion of said positioning member, said electrode portion is guided into said conducting path forming part.

2. The anisotropically conductive connector according to claim 1, wherein said perforated metallic member is formed to be grid-like and an insulating layer is formed in a portion surrounding portions other than at least a crossing portion of said perforated metallic member.

3. The anisotropically conductive connector according to claim 1, wherein said positioning member is integrally formed with said anisotropically conductive sheet by bonding said insulating layer formed in a portion surrounding said perforated metallic member to an insulating portion of said anisotropically conductive sheet.

4. The anisotropically conductive connector according to claim 1, wherein a step portion is formed in a region surrounding said anisotropically conductive film and a supporting body to support a peripheral edge portion of said anisotropically conductive film is formed in said step portion.

5. A converting adaptor to electrically connect an electronic component being a subject to be inspected having a protruded electrode portion with a circuit substrate for inspection having an electrode for inspection to be used for an inspecting apparatus installed in said inspecting apparatus to perform electrical inspections on an electronic component, comprising:

the anisotropically conductive connector according to claim 1.

6. An inspecting apparatus to electrically connect an electronic component being a subject to be inspected having a protruded electrode portion with a circuit substrate for inspection having an electrode for inspection and to perform electrical inspections on said electronic component, comprising:

the anisotropically conductive connector according to claim 1.

* * * * *